(12) United States Patent
Kawamura

(10) Patent No.: US 10,615,215 B2
(45) Date of Patent: Apr. 7, 2020

(54) SOLID-STATE IMAGING DEVICE WITH CHARGE HOLDING SECTION BETWEEN TRENCHED TRANSFER GATE SECTIONS, MANUFACTURING METHOD OF SAME, AND ELECTRONIC APPARATUS

(71) Applicant: Sony Semiconductor Solutions Corporation, Kanagawa (JP)

(72) Inventor: Takahiro Kawamura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/028,818

(22) Filed: Jul. 6, 2018

(65) Prior Publication Data

US 2018/0315785 A1 Nov. 1, 2018

Related U.S. Application Data

(63) Continuation of application No. 15/470,535, filed on Mar. 27, 2017, now Pat. No. 10,020,339, which is a continuation of application No. 14/831,328, filed on Aug. 20, 2015, now Pat. No. 9,608,036, which is a
(Continued)

(30) Foreign Application Priority Data

Sep. 9, 2013 (JP) .................................. 2013-185945

(51) Int. Cl.
*H01L 27/146* (2006.01)
*H01L 27/148* (2006.01)

(52) U.S. Cl.
CPC .... *H01L 27/1464* (2013.01); *H01L 27/14605* (2013.01); *H01L 27/14614* (2013.01); *H01L 27/14623* (2013.01); *H01L 27/14638* (2013.01); *H01L 27/14643* (2013.01);
(Continued)

(58) Field of Classification Search
CPC ........... H01L 27/1464; H01L 27/14605; H01L 27/14614; H01L 27/14623; H01L 27/14638; H01L 27/14643; H01L 27/14683; H01L 27/14689; H01L 27/14818
See application file for complete search history.

(56) References Cited

U.S. PATENT DOCUMENTS

2006/0081887 A1 4/2006 Lyu
2006/0145207 A1 7/2006 Kim
2007/0131987 A1 6/2007 Kim
(Continued)

FOREIGN PATENT DOCUMENTS

JP 2009-268083 11/2009

*Primary Examiner* — Peter Bradford
(74) *Attorney, Agent, or Firm* — Michael Best & Friedrich LLP

(57) ABSTRACT

A solid-state imaging device includes a pixel having a photoelectric conversion element which generates a charge in response to incident light, a first transfer gate which transfers the charge from the photoelectric conversion element to a charge holding section, and a second transfer gate which transfers the charge from the charge holding section to a floating diffusion. The first transfer gate includes a trench gate structure having at least two trench gate sections embedded in a depth direction of a semiconductor substrate, and the charge holding section includes a semiconductor region positioned between adjacent trench gate sections.

20 Claims, 16 Drawing Sheets

Related U.S. Application Data continuation of application No. 14/331,742, filed on Jul. 15, 2014, now Pat. No. 9,129,881.

(52) U.S. Cl.
CPC .. *H01L 27/14683* (2013.01); *H01L 27/14689* (2013.01); *H01L 27/14818* (2013.01)

(56) References Cited

U.S. PATENT DOCUMENTS

| | | |
|---|---|---|
| 2009/0251582 A1 | 10/2009 | Oike |
| 2009/0256230 A1 | 10/2009 | Watanabe |
| 2009/0266973 A1 | 10/2009 | Roy |
| 2011/0096208 A1 | 4/2011 | Roy |
| 2011/0248371 A1 | 10/2011 | Matsumura et al. |
| 2012/0061754 A1* | 3/2012 | Hsieh ............... H01L 29/0634 257/331 |
| 2012/0064684 A1* | 3/2012 | Hsieh ............... H01L 29/0634 438/270 |
| 2012/0187477 A1* | 7/2012 | Hsieh ............... H01L 29/0634 257/331 |
| 2012/0199882 A1 | 8/2012 | Shin |
| 2013/0076934 A1 | 3/2013 | Maeda |
| 2013/0193496 A1 | 8/2013 | Hisanori |
| 2014/0131779 A1 | 5/2014 | Takeda |
| 2014/0191290 A1 | 7/2014 | Funao |
| 2014/0284665 A1 | 9/2014 | Abe |
| 2016/0126276 A1* | 5/2016 | Nishizawa ........ H01L 27/14685 257/435 |

* cited by examiner

P-TYPE ION INJECTION

N-TYPE ION INJECTION

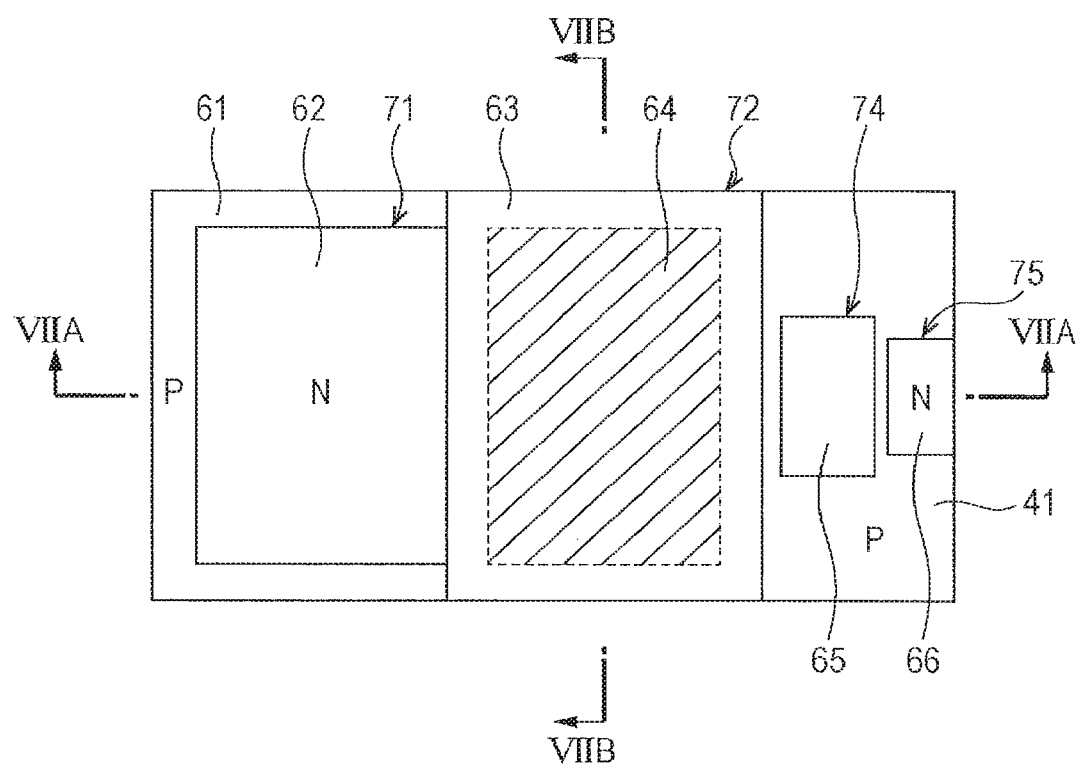

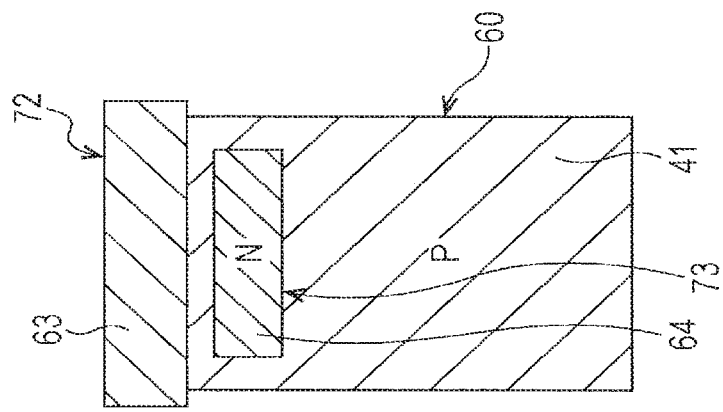
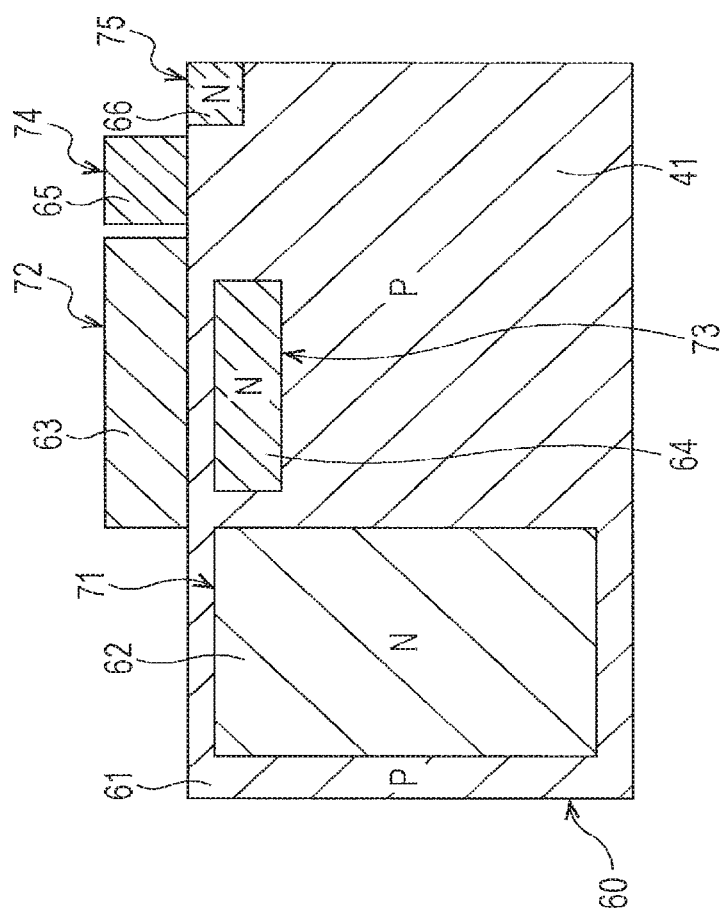

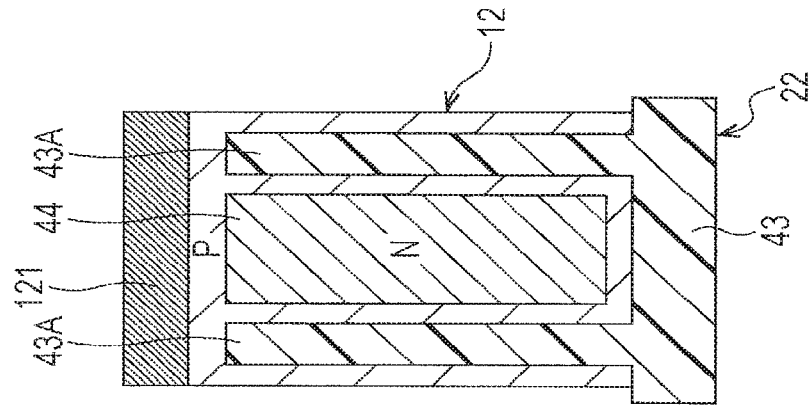
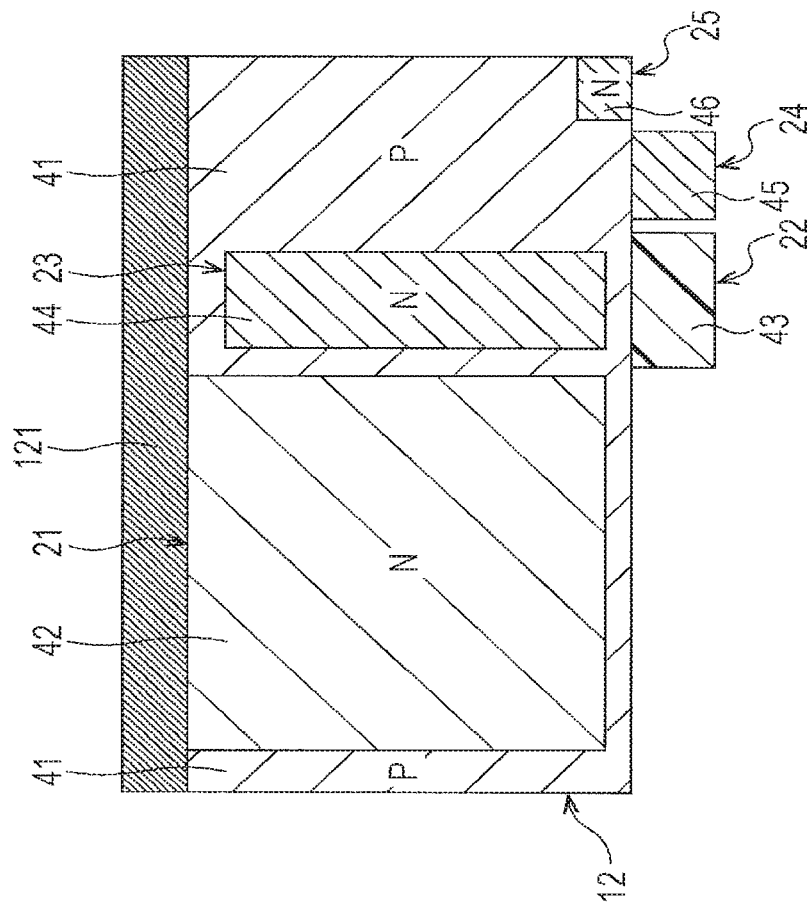

ND-STATE IMAGING DEVICE WITH
CHARGE HOLDING SECTION BETWEEN
TRENCHED TRANSFER GATE SECTIONS,
MANUFACTURING METHOD OF SAME,
AND ELECTRONIC APPARATUS

CROSS REFERENCE TO RELATED
APPLICATIONS

The present application is a Continuation of application Ser. No. 15/470,535, filed Mar. 27, 2017, which is a Continuation of application Ser. No. 14/831,328, filed Aug. 20, 2015, now U.S. Pat. No. 9,608,036, issued Mar. 28, 2017, which is a Continuation of application Ser. No. 14/331,742, filed Jul. 15, 2014, now U.S. Pat. No. 9,129,881, issued Sep. 8, 2015, which claims the benefit of Japanese Priority Patent Application JP 2013-185945 filed Sep. 9, 2013, the entire contents of which are incorporated herein by reference.

BACKGROUND

The present technology relates to a solid-state imaging device, a manufacturing method of the solid-state imaging device and an electronic apparatus, and specifically, relates to a solid-state imaging device that can increase an amount of a saturated charges in a solid-state imaging device capable of realizing a global shutter, a manufacturing method of the solid-state imaging device and an electronic apparatus.

In recent years, a CMOS solid-state imaging device (CMOS imaging sensor) is mounted on many electronic apparatuses such as a digital camera, a video camera, a surveillance camera, a copying machine and a facsimile.

In the CMOS solid-state imaging device, in order to read charges accumulated in a photodiode for each row, a gap occurs at a time for accumulating optical charges and distortion occurs in an object that is photographed when the object moves.

In order to prevent the distortion in the object, an all-pixel simultaneous electronic shutter in which exposure periods of each of pixels are the same as each other is being developed. The all-pixel simultaneous electronic shutter performs an operation in which the exposure is simultaneously started in all effective pixels in imaging and the exposure is simultaneously completed, and is also referred to as a global shutter (global exposure).

As a method for realizing the global shutter, for example, there is a method in which in each pixel, a charge holding region is provided between the photodiode as a charge accumulation region and a floating diffusion region (FD: Floating Diffusion), and the charges accumulated in the photodiode are simultaneously and temporarily transferred to the charge holding region for all pixels, and the charges accumulated in the charge holding region are read by performing sequential scanning for each row.

For the charge holding region, a structure is used which has a PN junction in which first conductivity type and second conductivity type semiconductor regions are laminated in a semiconductor substrate, and a planar type gate electrode that controls charge transfer through an insulating film on an upper section of the PN junction (for example, Japanese Unexamined Patent Application Publication No. 2009-268083).

In the CMOS solid-state imaging device realizing the global shutter, it is necessary to hold a maximum amount (amount of saturated charges) of a charge signal that is accumulated in the photodiode in the charge holding region.

SUMMARY

However, in order to increase a holding capacity of the charge holding region, when increasing an area of the charge holding region, an area of the photodiode is reduced, on the contrary. Thus, the area of the photodiode for unit pixel size is reduced and light reception sensitivity thereof or the amount of the saturated charges of the photodiode is lowered compared to that of a non-global shutter type CMOS solid-state imaging device.

In the present technology, it is desirable to increase an amount of saturated charges in a solid-state imaging device capable of realizing a global shutter.

According to an embodiment of the present technology, there is provided a solid-state imaging device comprising: a pixel including a photoelectric conversion element configured to generate a charge in response to incident light, a first transfer gate configured to transfer the charge from the photoelectric conversion element to a charge holding section, and a second transfer gate configured to transfer the charge from the charge holding section to a floating diffusion, wherein the first transfer gate includes a trench gate structure having at least two trench gate sections embedded in a depth direction of a semiconductor substrate, and the charge holding section includes a semiconductor region positioned between adjacent ones of the plurality of trench gate sections.

According to another embodiment of the present technology, there is provided a manufacturing method of a solid-state imaging device, comprising: providing a semiconductor substrate; forming a pixel on the semiconductor substrate, the pixel including a photoelectric conversion element configured to generate a charge in response to incident light, a first transfer gate configured to transfer the charge from the photoelectric conversion element to a charge holding section, and a second transfer gate configured to transfer the charge from the charge holding section to a floating diffusion, wherein the first transfer gate includes a trench gate structure having at least two trench gate sections embedded in a depth direction of a semiconductor substrate, and the charge holding section includes a semiconductor region positioned between adjacent ones of the plurality of trench gate sections.

According to still another embodiment of the present technology, there is provided an electronic apparatus comprising: an optical section; a solid-state imaging device; and a digital signal processor circuit, wherein the solid-state imaging device includes: a pixel including a photoelectric conversion element configured to generate a charge in response to incident light, a first transfer gate configured to transfer the charge from the photoelectric conversion element to a charge holding section, and a second transfer gate configured to transfer the charge from the charge holding section to a floating diffusion, wherein the first transfer gate includes a trench gate structure having at least two trench gate sections embedded in a depth direction of a semiconductor substrate, and the charge holding section includes a semiconductor region positioned between adjacent ones of the plurality of trench gate sections.

In the above embodiments of the present technology, the gate electrode of the first transfer transistor is configured to have two or more trench gate sections embedded from the interface of the semiconductor substrate to the predetermined depth, and the charge accumulation section is formed vertically long between the two trench gate sections of the first transfer transistor embedded in the semiconductor substrate.

The solid-state imaging device and the electronic apparatus may be an independent device or may be a module to be incorporated into other devices.

According to the above embodiments of the present technology, it is possible to increase the amount of the saturated charges in the solid-state imaging device capable of realizing the global shutter.

Moreover, the effects described here are not necessarily limited and any of effects may be effective in the disclosure.

BRIEF DESCRIPTION OF THE DRAWINGS

FIG. 6 is a plan view illustrating a pixel structure of a planar type first transfer transistor;

FIGS. 7A and 7B are cross-sectional views illustrating the pixel structure of the planar type first transfer transistor;

FIGS. 17A and 17B are cross-sectional views illustrating a schematic configuration of the pixel in the fifth embodiment.

DETAILED DESCRIPTION OF EMBODIMENTS

Hereinafter, an embodiment of the present technology is described. Moreover, the description is made in the following order.

1. Schematic Configuration Example of Solid-State Imaging Device
2. Circuit Configuration Example of Pixel
3. First Embodiment (Configuration Example Having Two Trench Gate Sections) of Pixel
4. Second Embodiment (Configuration Example Having Three Trench Gate Sections) of Pixel
5. Third Embodiment (Configuration Example Having Light-Shielding Material Inside Trench Gate Section) of Pixel
6. Fourth Embodiment (Configuration Example of Back Surface Irradiation Type) of Pixel
7. Fifth Embodiment (Configuration Example Having Photoelectric Conversion Film of Back Surface Irradiation Type) of Pixel
8. Application Example to Electronic Apparatus 1. Schematic Configuration Example of Solid-State Imaging Device FIG. 1 illustrates a schematic configuration of a solid-state imaging device to which the present technology is applied.

Figure 1:
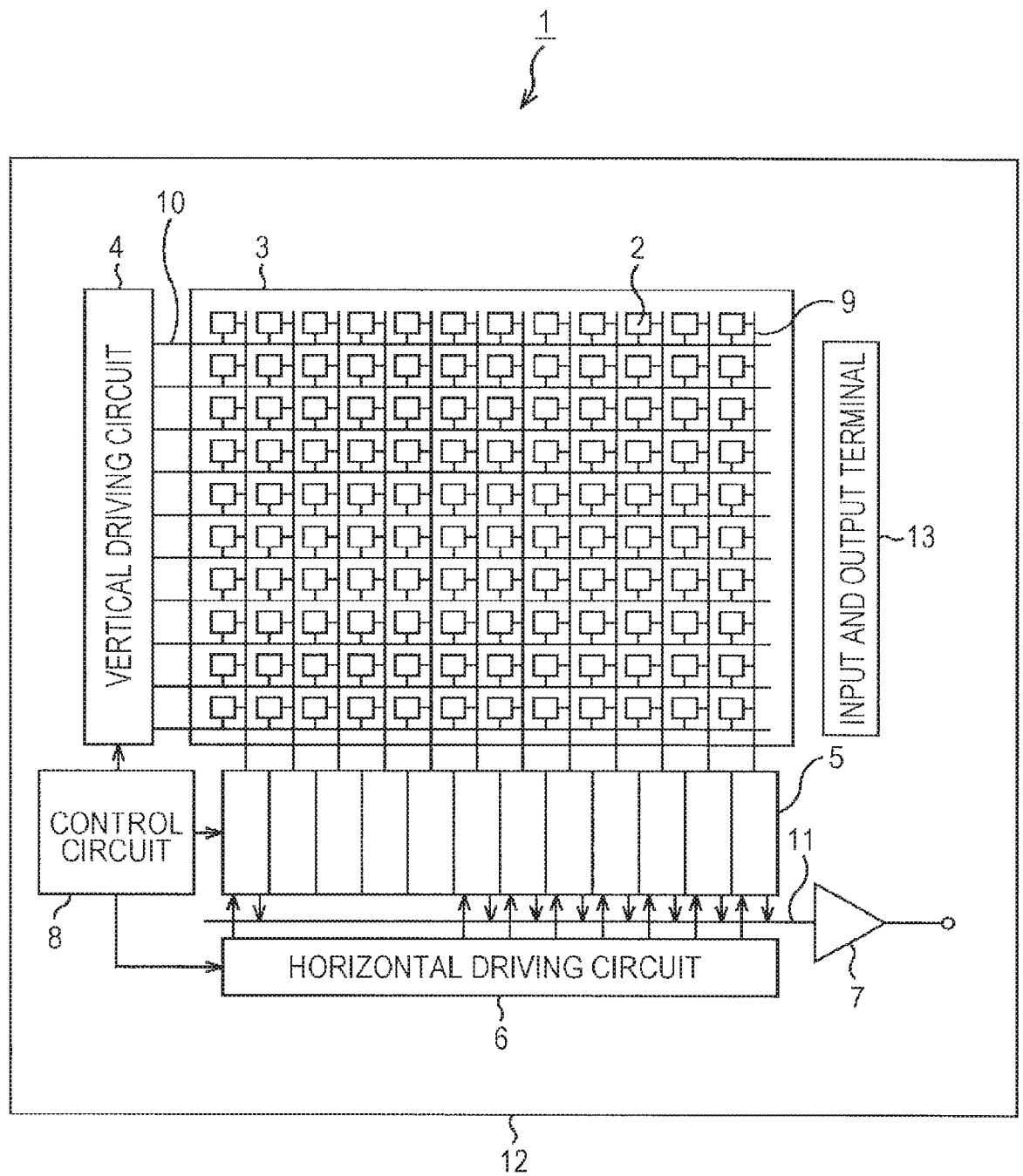
FIG. 1 is a view illustrating a schematic configuration of a solid-state imaging device to which the present technology is applied.

A solid-state imaging device 1 in FIG. 1 is configured to have a pixel array section 3 in which each pixel 2 is arranged in a two-dimensional array and peripheral circuit sections in the periphery thereof in a semiconductor substrate 12 using, for example, silicon (Si) as a semiconductor. The peripheral circuit sections include a vertical driving circuit 4, a column signal processing circuit 5, a horizontal driving circuit 6, an output circuit 7, a control circuit 8 and the like.

The pixel 2 is configured to have a photodiode as a photoelectric conversion element and a plurality of pixel transistors. A configuration example of the pixel 2 is described below with reference to FIG. 2.

Further, the pixel 2 can also be a shared pixel structure. The shared pixel structure is configured of a plurality of photodiodes, a plurality of transfer transistors, one floating diffusion (floating diffusion region) that is shared, and each of other pixel transistors that are shared. That is, in the shared pixel, the photodiode and the transfer transistor configuring a plurality of unit pixels are configured to share another pixel transistor.

The control circuit 8 receives data for instructing an input clock, an operation mode and the like, and outputs data such as internal information of the solid-state imaging device 1 and the like. That is, the control circuit 8 generates a clock signal or a control signal as a reference for the operation of the vertical driving circuit 4, the column signal processing circuit 5, the horizontal driving circuit 6 and the like, based on a vertical synchronization signal, a horizontal synchronization signal and a master clock. Then, the control circuit 8 outputs the clock signal or the control signal that is generated to the vertical driving circuit 4, the column signal processing circuit 5, the horizontal driving circuit 6 and the like.

For example, the vertical driving circuit 4 is configured of a shift register and selects a pixel driving wiring 10, and supplies a pulse for driving the pixel 2 to the pixel driving wiring 10 that is selected, and drives the pixels 2 on a row-by-row basis. That is, the vertical driving circuit 4 selectively scans each pixel 2 of the pixel array section 3 sequentially in a vertical direction on a row-by-row basis and supplies the pixel signal to the column signal processing circuit 5 through a vertical signal line 9, based on signal charges generated depending on an amount of received light in the photoelectric conversion section of each pixel 2.

The column signal processing circuit 5 is disposed for each column of the pixels 2 and performs a signal process such as noise removal for each pixel column with respect to the signal output from the pixels 2 of one row. For example, the column signal processing circuit 5 performs the signal process such as a Correlated Double Sampling (CDS) for removing fixed pattern noise unique to the pixel, and AD conversion.

For example, the horizontal driving circuit 6 is configured of the shift register and selects in turn each of the column signal processing circuits 5 by sequentially outputting horizontal scanning pulses, and outputs the pixel signal from each of the column signal processing circuits 5 to a horizontal signal line 11.

The output circuit 7 outputs the signal by performing the signal process with respect to the signals sequentially supplied from each of the column signal processing circuits 5 through the horizontal signal line 11. For example, the output circuit 7 may perform only buffering or may perform black level adjustment, column variation correction, various types of digital signal processes and the like. An input and output terminal 13 exchanges a signal to and from the outside.

The solid-state imaging device 1 configured as described above is a CMOS image sensor called a column AD type in which the column signal processing circuit 5 performing a CDS process and an AD conversion process is disposed for each pixel column.

2. Circuit Configuration Example of Pixel 2

Figure 2:
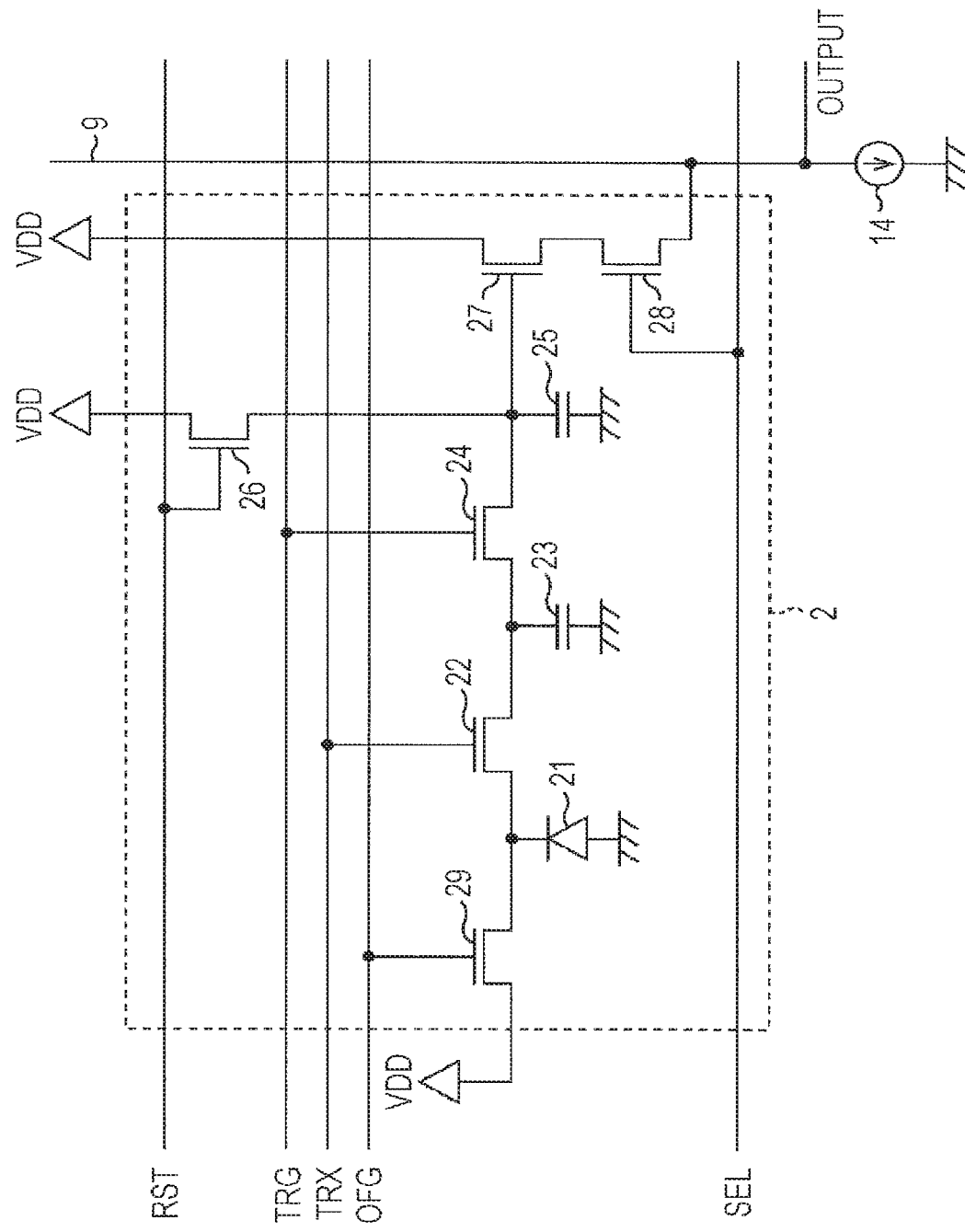
FIG. 2 is a view illustrating an equivalent circuit of a pixel.

FIG. 2 illustrates an equivalent circuit of the pixel 2.

The pixel 2 has a photodiode 21 as a photoelectric conversion element, a first transfer transistor 22, a memory section (MEM) 23, a second transfer transistor 24, a floating diffusion (FD) 25, a reset transistor 26, an amplification transistor 27, a selection transistor 28, and a discharge transistor 29.

The photodiode 21 is a photoelectric conversion section that generates and accumulates charges (signal charges) depending on an amount of received light. An anode terminal of the photodiode 21 is grounded and a cathode terminal is connected to the memory section 23 through the first transfer transistor 22. Further, the cathode terminal of the photodiode 21 is also connected to the discharge transistor 29.

When the first transfer transistor 22 is turned ON by a transfer signal TRX, the first transfer transistor 22 reads the charges generated in the photodiode 21 and transfers the charges to the memory section 23. The memory section 23 is a charge holding section that temporarily holds the charges until the charges are transferred to the FD 25. When the second transfer transistor 24 is turned ON by a transfer signal TRG, the second transfer transistor 24 transfers the charges held in the memory section 23 to the FD 25.

The FD 25 is a charge holding section that holds the charges that are read from the memory section 23 for reading the charges as a signal. When the reset transistor 26 is turned ON by a reset signal RST, a potential of the FD 25 is reset by discharging the charges held in the FD 25 to a constant voltage source VDD.

The amplification transistor 27 outputs the pixel signal depending on the potential of the FD 25. That is, the amplification transistor 27 configures a source follower circuit with a load MOS 14 as the constant voltage source, and the pixel signal indicating a level depending on the charges held in the FD 25 is output from the amplification transistor 27 to the column signal processing circuit 5 (FIG. 1) through the selection transistor 28. For example, the load MOS 14 is provided inside the column signal processing circuit 5.

The selection transistor 28 is turned ON when the pixel 2 is selected by a select signal SEL and outputs the pixel signal of the pixel 2 to the column signal processing circuit 5 through the vertical signal line 9. The discharge transistor 29 discharges unnecessary charges that are accumulated in the photodiode 21 to the constant voltage source VDD when turned ON by a discharge signal OFG. The transfer signals TRX and TRG, the reset signal RST, the select signal SEL, and a discharge signal OFG are controlled by the vertical driving circuit 4 and are supplied through the horizontal signal line 11 (FIG. 1).

An operation of the pixel 2 is simply described.

First, the discharge transistor 29 is turned ON by supplying the discharge signal OFG of High level to the discharge transistor 29 before the exposure is started, and the charges accumulated in the photodiode 21 are discharged to the constant voltage source VDD, and the photodiode 21 is reset.

When the discharge transistor 29 is turned OFF by the discharge signal OFG of Low level after the photodiode 21 is reset, the exposure is started in all pixels.

When a predetermined exposure time that is determined in advance has elapsed, the first transfer transistor 22 is turned ON by a first transfer signal TRX in all pixels of the pixel array section 3, and the charges accumulated in the photodiode 21 are transferred to the memory section 23.

The charges held in the memory section 23 of each pixel 2 are sequentially read to an ADC 15 on a row-by-row basis after the first transfer transistor 22 is turned OFF. In the reading operation, the second transfer transistor 24 of the pixel 2 of a reading row is turned ON by a second transfer signal TRG and the charges held in the memory section 23 are transferred to the FD 25. Then, the signal indicating the level depending on the charges held in the FD 25 are output from the amplification transistor 27 to the ADC 15 through the selection transistor 28 by the selection transistor 28 being turned ON by the select signal SEL.

3. First Embodiment of Pixel 2

Schematic Configuration View of Pixel 2

Structures of the photodiode 21, the first transfer transistor 22, the memory section 23, the second transfer transistor 24 and the FD 25 inside the pixel 2 are described with reference to FIGS. 3 to 4B.

Figure 3:
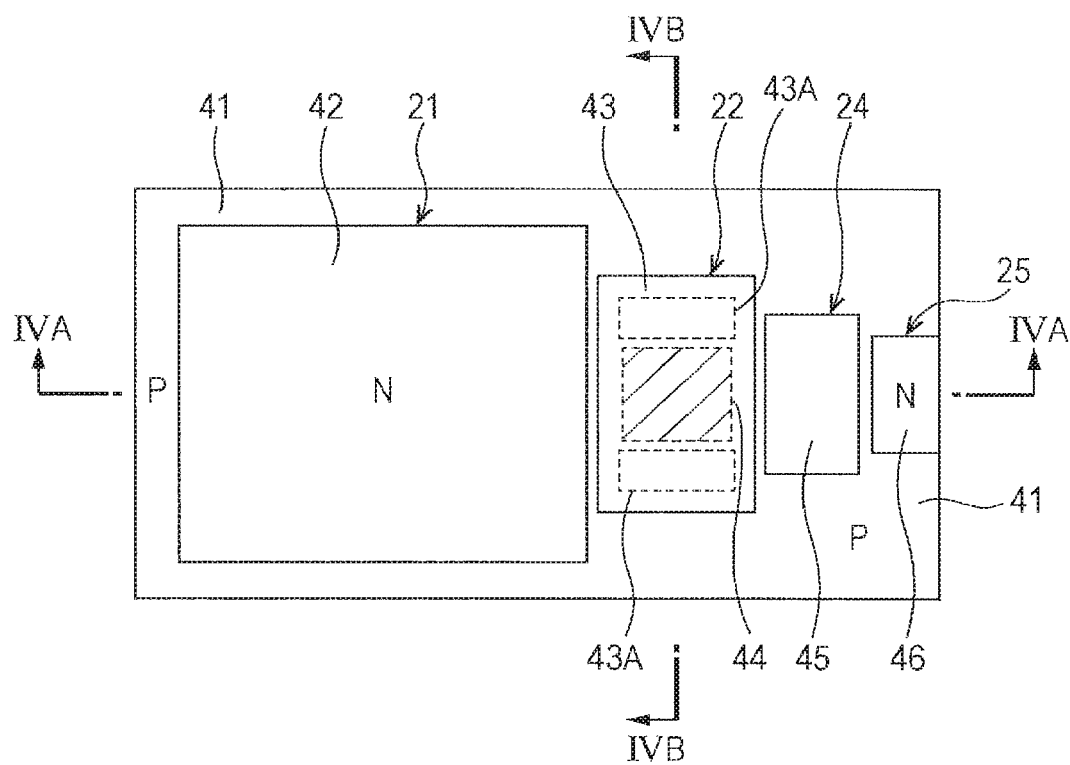
FIG. 3 is a plan view illustrating a schematic configuration of the pixel in a first embodiment.

FIG. 3 is a plan view illustrating a positional relationship between the photodiode 21, the first transfer transistor 22, the memory section 23, the second transfer transistor 24 and the FD 25 inside the pixel 2.

Figure 4B:
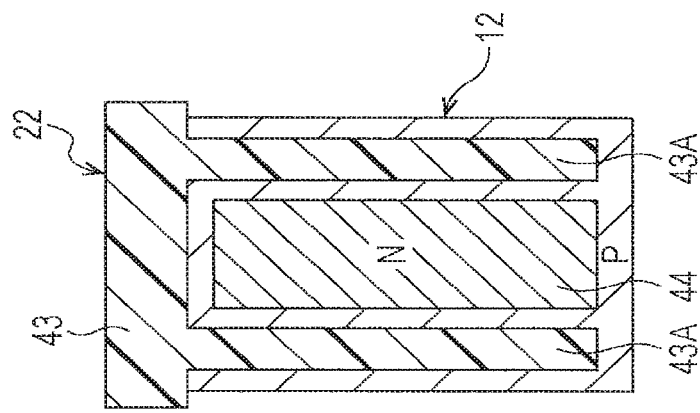
FIGS. 4A and 4B are cross-sectional views illustrating a schematic configuration of the pixel in the first embodiment.
Figure 4A:
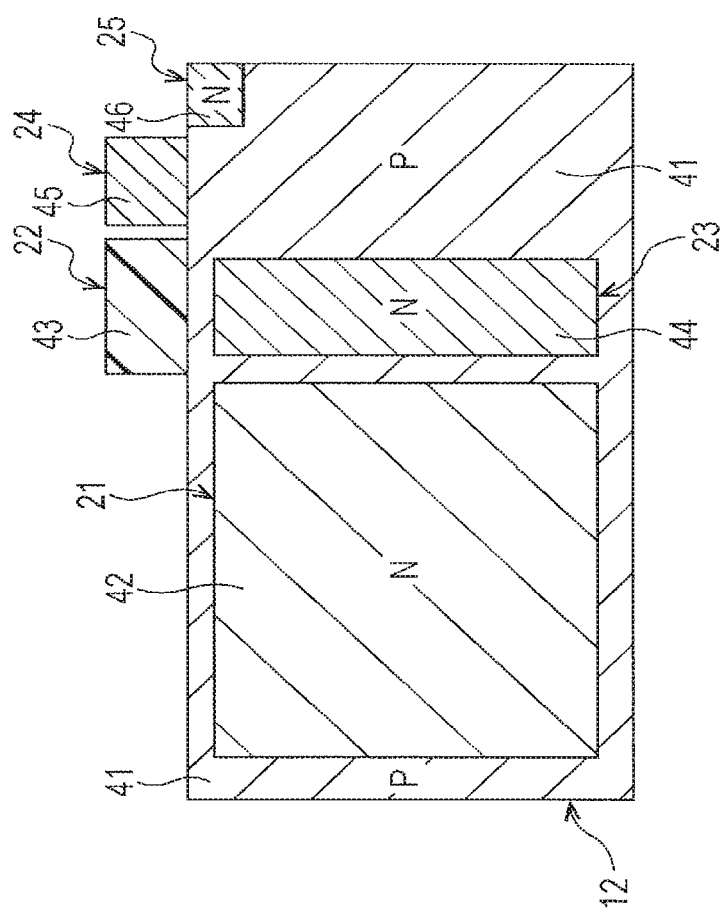

FIG. 4A illustrates a cross-sectional view taken along line IVA-IVA of FIG. 3 and FIG. 4B illustrates a cross-sectional view taken along line IVB-IVB of FIG. 3.

Moreover, FIG. 3 is a plan view that is viewed from a surface side of the semiconductor substrate 12 that is an incident side of the light. In FIGS. 4A and 4B, an upper side of each view is the surface of the semiconductor substrate 12 on which the light is incident.

As illustrated in FIG. 3, in each pixel 2 of the pixel array section 3, the photodiode 21, the first transfer transistor 22, the second transfer transistor 24 and the FD 25 are arranged in a predetermined direction. In FIG. 3, a lateral direction in which the photodiode 21, the first transfer transistor 22, the second transfer transistor 24 and the FD 25 are arranged is referred to as a first direction.

In the left side inside the pixel 2 of the semiconductor substrate 12, the photodiode 21 is formed by forming an N-type semiconductor region 42 that is a second conductivity type inside a P-type semiconductor region 41 that is a first conductivity type.

Then, as illustrated in FIGS. 3 and 4A, a gate electrode 43 of the first transfer transistor 22 is formed on the right side of the photodiode 21, and an N-type semiconductor region 44 that is a charge holding region of the memory section 23 is formed on a lower side of the gate electrode 43. The N-type semiconductor region 42 that is a charge accumulation region of the photodiode 21 also serves as one side of a source/drain region of the first transfer transistor 22, and the N-type semiconductor region 44 that is a charge holding region of the memory section 23 also serves as the other side of the source/drain region of the first transfer transistor 22.

Further, as illustrated in FIG. 4B, the gate electrode 43 of the first transfer transistor 22 has a trench gate structure in which two trench gate sections 43A are embedded in a depth direction of the semiconductor substrate 12. As illustrated in FIG. 3, the two trench gate sections 43A are disposed so as to sandwich the N-type semiconductor region 44 that is the memory section 23 from the second direction perpendicular to the first direction that is the transfer direction of the charges. As illustrated in FIG. 4B, the depth of the trench gate section 43A that is embedded is substantially the same as that of the N-type semiconductor region 44 of the memory section 23.

In other words, the N-type semiconductor region 44 that is the charge holding region of the memory section 23 is formed vertically long along a side wall of the two trench gate sections 43A of the first transfer transistor 22. Then, P-type/N-type/P-type semiconductor regions are formed in the horizontal direction between the two trench gate sections 43A.

Moreover, in FIG. 3, the two trench gate sections 43A of the gate electrode 43 of the first transfer transistor 22 and the N-type semiconductor region 44 (the memory section 23) that is formed on the lower side of the gate electrode 43 are illustrated in broken lines.

Then, as illustrated in FIGS. 3 and 4A, a gate electrode 45 of the second transfer transistor 24 is formed on the opposite side to the side on which the photodiode 21 is formed with respect to the gate electrode 43 of the first transfer transistor 22, and an N-type semiconductor region 46 that is the FD 25 is formed on the surface side of the substrate further on the right side thereof. The N-type semiconductor region 44 that is the charge holding region of the memory section 23 also serves as one side of the source/drain region of the second transfer transistor 24 and the N-type semiconductor region 46 that is the FD 25 also serves as the other side of the source/drain region of the second transfer transistor 24.

Moreover, in FIGS. 4A and 4B, a multilayered wiring layer formed of a plurality of wiring layers and an interlayer insulating film, a color filter, an on-chip lens or the like is formed on an upper surface of the gate electrode 43 of the first transfer transistor 22 or the gate electrode 45 of the second transfer transistor 24, which is the side of the light incident surface.

As described above, in the first embodiment of the pixel 2, the gate electrode 43 of the first transfer transistor 22 has the transfer gate structure in which the two trench gate sections 43A are embedded in the depth direction of the semiconductor substrate 12. On the other hand, the gate electrode 45 of the second transfer transistor 24 has the planar type gate structure that is formed only on the surface of the semiconductor substrate.

Then, the N-type semiconductor region 44 as the memory section 23 is formed vertically long between the two trench gate sections 43A of the first transfer transistor 22 and the memory section 23 has a PN junction surface in the vertical direction that is the depth direction of the substrate.

Therefore, it is possible to provide the N-type semiconductor region 44 as the memory section 23 without reducing the charge accumulation region of the photodiode 21 and it is possible to prevent the light reception sensitivity or the amount of the saturated charges from being lowered according to reduction of the area of the photodiode.

Manufacturing Method

A forming method of the gate electrode 43 of the first transfer transistor 22 and the N-type semiconductor region 44 that is the memory section 23 is described with reference to FIGS. 5A to 5D.

Figure 5A:
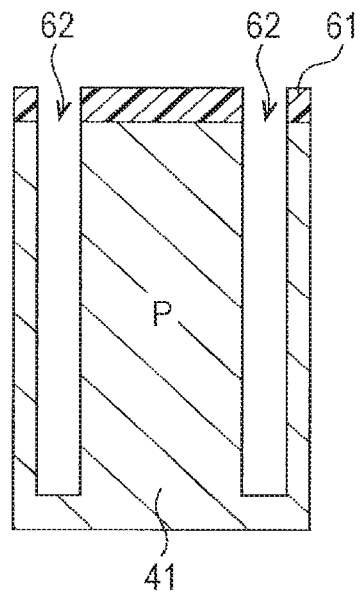
FIGS. 5A to 5D are views describing a forming method of a memory section.

First, as illustrated in FIG. 5A, a resist mask 61 is patterned so as to open regions which form the two trench gate sections 43A and then the P-type semiconductor region 41 is etched to a predetermined depth. Therefore, two trench sections 62 which become the trench gate sections 43A of the first transfer transistor 22 are formed.

Figure 5B:
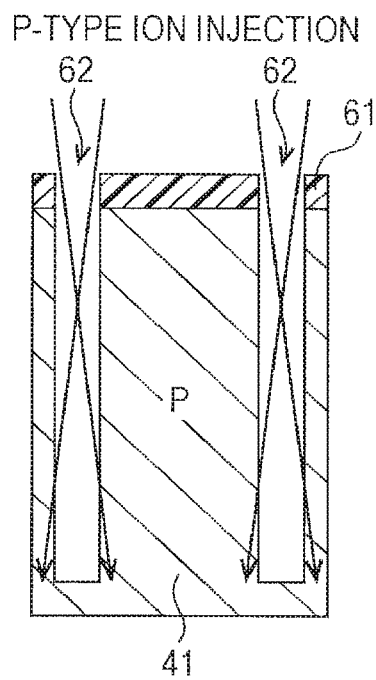

Then, as illustrated in FIG. 5B, for example, P-type ions such as boron (B) are injected at low acceleration energy to the immediate vicinity of the side wall of the trench section 62.

Figure 5C:
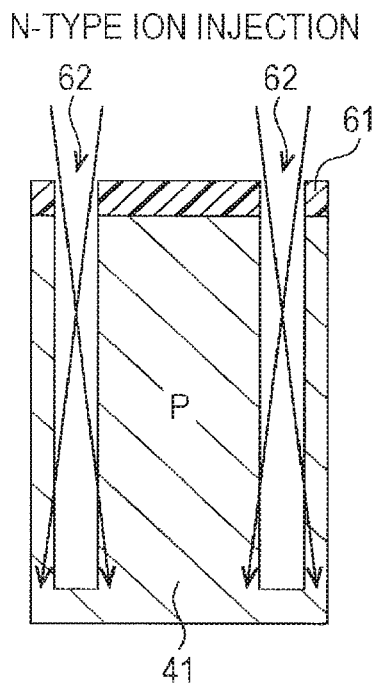

Next, as illustrated in FIG. 5C, for example, N-type ions such as phosphorus (P) or arsenic (As) are injected. At this time, the ions are injected at higher acceleration energy than that when P-type ions are injected so as to inject the N-type ions into the inside from the side wall of the trench section 62.

Moreover, the P-type ions and the N-type ions are injected with a predetermined tilt (tilt angle) so as to be incident obliquely to the side wall of the trench section 62.

Figure 5D:
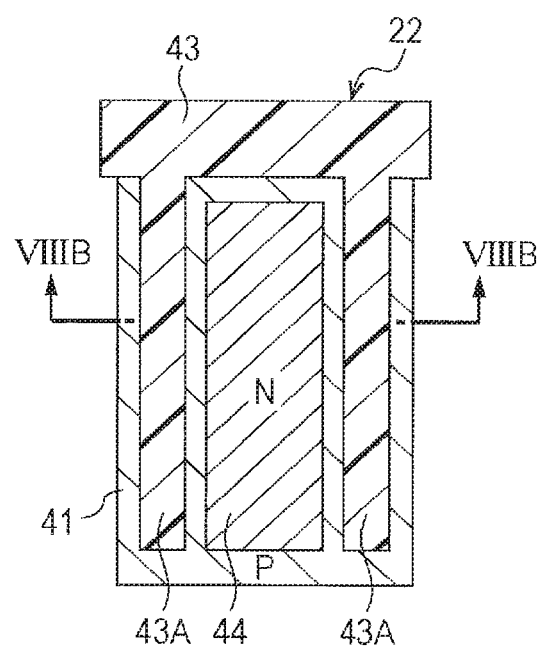

Then, as illustrated in FIG. 5D, the resist mask 61 is peeled off and then the gate electrode 43 of the first transfer transistor 22 is embedded in the trench sections 62 and is also formed on the surface of the semiconductor substrate 12. As a material of the gate electrode 43, for example, it is possible to employ polysilicon.

Through the above process, the gate electrode 43 of the first transfer transistor 22 including the two trench gate sections 43A is completed and the N-type semiconductor region 44 that is the charge holding region of the memory section 23 is formed between the two trench gate sections 43A.

Moreover, in the example of FIGS. 5A to 5D, the injection of the P-type ions is performed and then the injection of the N-type ions is performed, but the order of the injection of the P-type ions and the injection of the N-type ions may be reversed.

Pixel Structure of Planar Type First Transfer Transistor

In order to facilitate understanding of the effects of the pixel structure to which the present technology is applied, the pixel structure having the planar type first transfer transistor is described with reference to FIGS. 6 to 7B.

FIG. 6 is a plan view illustrating a positional relationship between a photodiode 71, a first transfer transistor 72, a memory section 73, a second transfer transistor 74, and a FD 75 of a pixel having a planar type first transfer transistor that is illustrated so as to correspond to FIG. 3.

Further, FIG. 7A illustrates a cross-sectional view taken along line VIIA-VIIA of FIG. 6 and FIG. 7B illustrates a cross-sectional view taken along line VIIB-VIIB of FIG. 6.

As illustrated in FIG. 6, the photodiode 71, the first transfer transistor 72, the second transfer transistor 74 and the FD 75 are arranged in a first direction similar to FIG. 3.

In the left side inside the pixel of a semiconductor substrate 60, the photodiode 71 is formed by forming an N-type semiconductor region 62 that is a second conductivity type inside a P-type semiconductor region 61 that is a first conductivity type.

Then, as illustrated in FIGS. 6 and 7A, a gate electrode 63 of the first transfer transistor 72 is formed in a plane only on the surface of the semiconductor substrate having an area greater than a light receiving area of the photodiode 71 on the right side object photodiode 71, and an N-type semiconductor region 64 that is a charge holding region of the memory section 73 is formed to have a plane area at the same level as the light receiving area of the photodiode 71 in the vicinity of the lower side of the gate electrode 63.

The N-type semiconductor region 62 that is a charge accumulation region of the photodiode 71 also serves as one side of a source/drain region of the first transfer transistor 72 and the N-type semiconductor region 64 that is a charge holding region of the memory section 73 also serves as the other side of the source/drain region of the first transfer transistor 72.

Then, as illustrated in FIGS. 6 and 7A, the gate electrode 65 of the second transfer transistor 74 is formed on the opposite side to the side on which the photodiode 71 is formed with respect to the gate electrode 63 of the first transfer transistor 72, and an N-type semiconductor region 66 that is the FD 75 is formed on the surface side of the substrate further on the right side thereof. The N-type semiconductor region 64 that is the charge holding region of the memory section 73 also serves as one side of the source/drain region of the second transfer transistor 74 and the N-type semiconductor region 66 that is the FD 75 also serves as the other side of the source/drain region of the second transfer transistor 74.

As described above, in the pixel structure having the planar type first transfer transistor 72, since the N-type semiconductor region 64 that is the charge holding region of the memory section 73 is formed in a plane having a plane area at the same level as the light receiving area of the photodiode 71, the charge accumulation region of the photodiode 71 is small compared to the charge accumulation region of the photodiode 21 described above. Thus, there is a problem that the light reception sensitivity or the amount of the saturated charges of the photodiode is lowered.

It is possible to increase a potential amplitude when the charges are depleted and saturated and it is possible to increase the amount of the saturated charges of the memory section 73 by increasing the impurity concentration of the N-type semiconductor region 64 instead of increasing the area of the N-type semiconductor region 64 that is the charge holding region of the memory section 73, but in this case, disadvantage occurs that the charge transfer is difficult.

Otherwise, it is possible to increase a junction capacity per unit area and to increase the amount of the saturated charges of the memory section 73 without changing the potential when the charges are depleted and accumulated by designing largely a junction electric field of the P-type and the N-type semiconductor regions of the memory section 73 instead of increasing the area of the N-type semiconductor region 64 that is the charge holding region of the memory section 73, but in this case, a disadvantage occurs that the noise is increased when dark by a strong junction electric field.

Figure 8A:
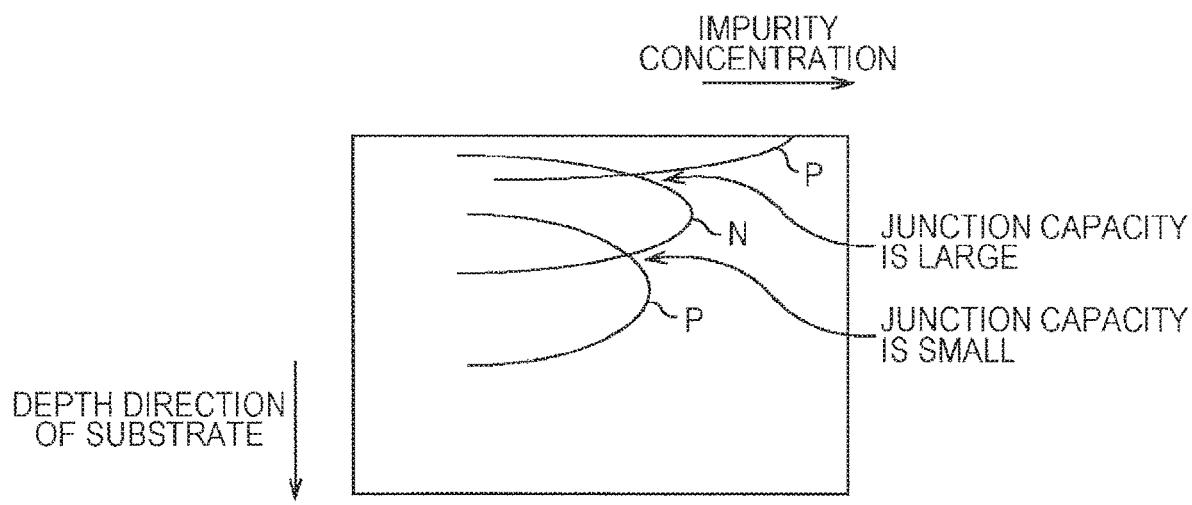
FIGS. 8A and 8B are views illustrating an impurity concentration profile.

FIG. 8A illustrates an impurity concentration profile of a case where the N-type semiconductor region 64 of the memory section 73 is formed in a plane and the PN junction is formed on a horizontal surface as illustrated in FIGS. 7A and 7B.

The PN junction of the upper side of the N-type semiconductor region 64 that is the charge holding region of the memory section 73 and the P-N-P junction that is the PN junction of the lower side of the N-type semiconductor region 64 are formed in the depth direction of the substrate by injecting the ions from the surface side of the semiconductor substrate 12. In this case, in principle, since the impurity concentration profile spreads as the acceleration energy increases, a junction capacity per unit area of the PN junction on the lower side of the memory section 73 is smaller than that of the PN junction on the upper side of the memory section 73.

Figure 8B:
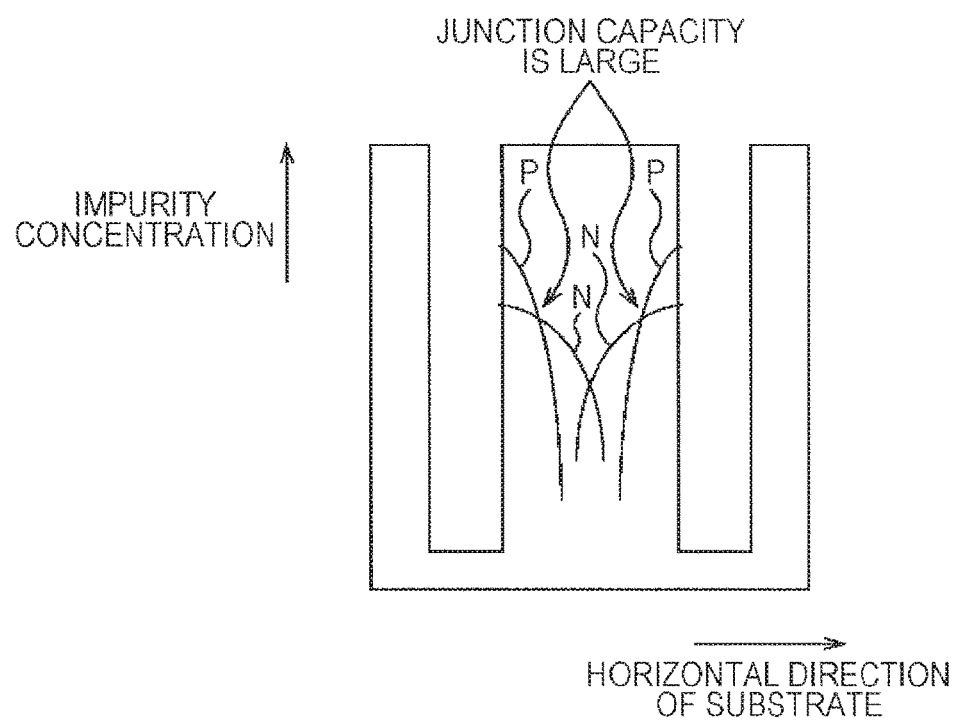

FIG. 8B is an impurity concentration profile in a case where, as illustrated in FIGS. 4A and 4B, the N-type semiconductor region 44 of the memory section 23 is vertically formed and the PN junction is formed on the vertical surface, and illustrates the impurity concentration profile between two trench gate sections 43A in line VIIIB-VIIIB of FIG. 5D.

In the P-N-P junction between the two trench gate sections 43A, both the PN junction near the side wall of the trench section 62 of the right side and the PN junction near the side wall of the trench section 62 of the left side are configured of an impurity profile that is formed by low acceleration energy. Thus, both the PN junction of the right side and the PN junction of the left side can realize high junction capacity.

Therefore, according to the pixel structure of the pixel 2 having the PN junction surface in the vertical direction to which the present technology is applied, it is also possible to increase the amount of the saturated charges of the memory section 23 without lowering the amount of the saturated charges of the photodiode 21.

Modification Example of Manufacturing Method

A modification example of a forming method of an N-type semiconductor region 44 that is a memory section 23 is described with reference to FIGS. 9A to 9C.

When the injection of the N-type ions is performed, it is possible to change the impurity concentration of the N-type semiconductor region 44 that is the memory section 23 depending on the depth thereof by changing the tilt angle of the injection of the ions depending on the depth of the substrate of the trench section 62.

Figure 9A:
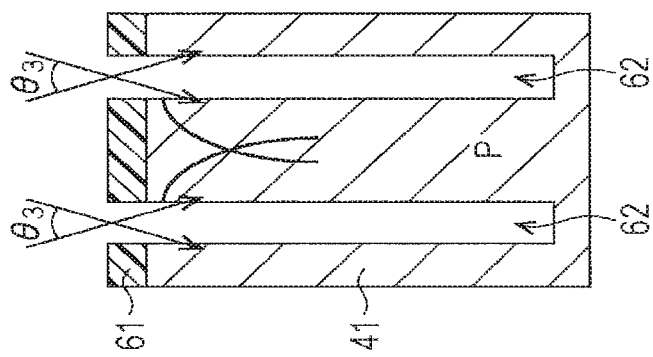
FIGS. 9A to 9C are views describing a modification example of a forming method of a memory section.
Figure 9B:
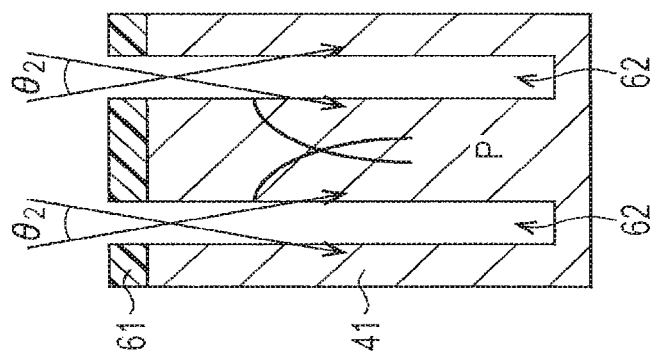
Figure 9C:
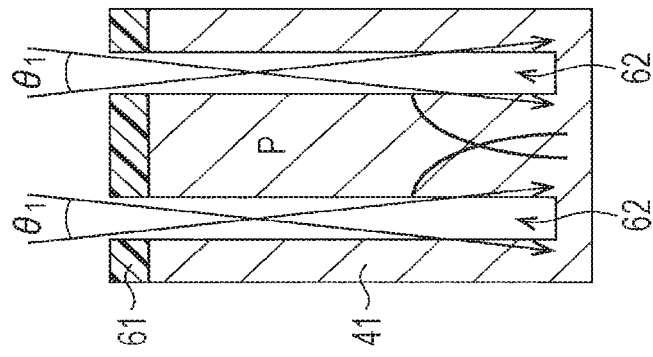

For example, the injection of the N-type ions is performed so that a relationship of $\theta_1 < \theta_2 < \theta_3$ is satisfied when the tilt angle of the injection of the ions in a deep position of the trench section 62 illustrated in FIG. 9A is $\theta_1$, the tilt angle of the injection of the ions in an intermediate position of the trench section 62 illustrated in FIG. 9B is $\theta_2$ and the tilt angle of the injection of the ions in a shallow position of the trench section 62 illustrated in FIG. 9C is $\theta_3$.

Therefore, the impurity concentration of the N-type semiconductor region 44 of the memory section 23 becomes thick in the shallow position of the surface side of the substrate and becomes thin in the deep position. In other words, the potential of the N-type semiconductor region 44 of the memory section 23 is high in the shallow position of the surface side of the substrate and is low in the deep position thereof.

By doing so, when reading the charges from the memory section 23, it is possible to generate the electric field to assist the charge transfer and to facilitate the reading of the charges from the memory section 23.

Moreover, the impurity concentration of the N-type semiconductor region 44 of the memory section 23 may not change in proportion to the depth but the semiconductor region 44 may be divided into a plurality of regions in the depth direction and the impurity concentration may become thick as moving to the surface side of the substrate.

4. Second Embodiment of Pixel 2

A second embodiment of the pixel 2 is described with reference to FIGS. 10 and 11.

Figure 10:
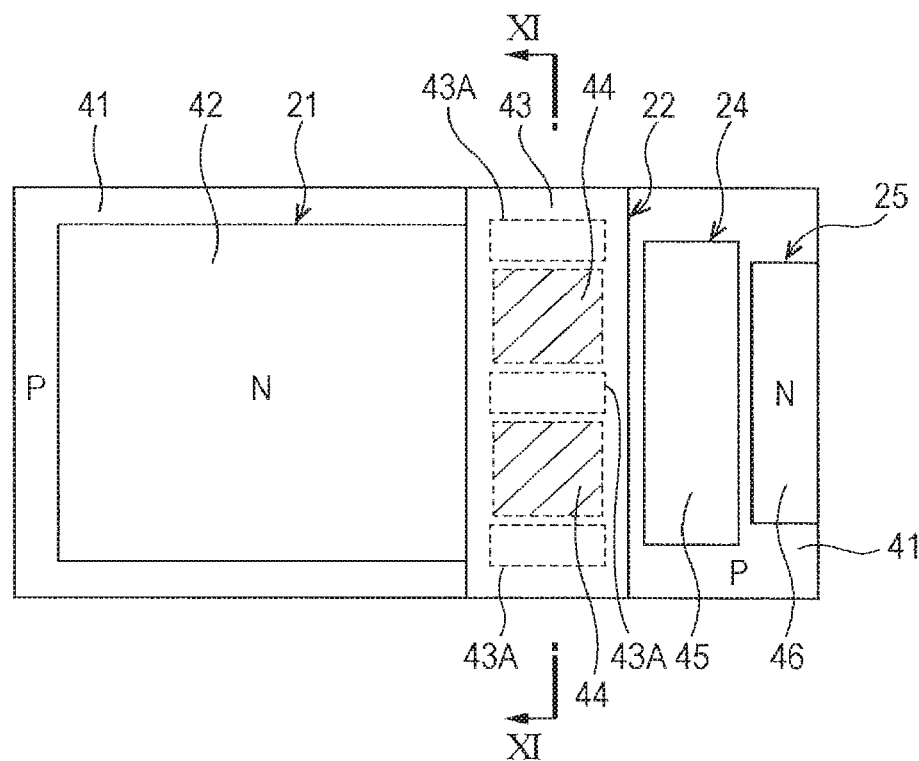
FIG. 10 is a plan view illustrating a schematic configuration of a pixel in a second embodiment.

FIG. 10 is a plan view illustrating a positional relationship between a photodiode 21, a first transfer transistor 22, a memory section 23, a second transfer transistor 24 and a FD 25 inside the pixel 2 in the second embodiment.

Figure 11:
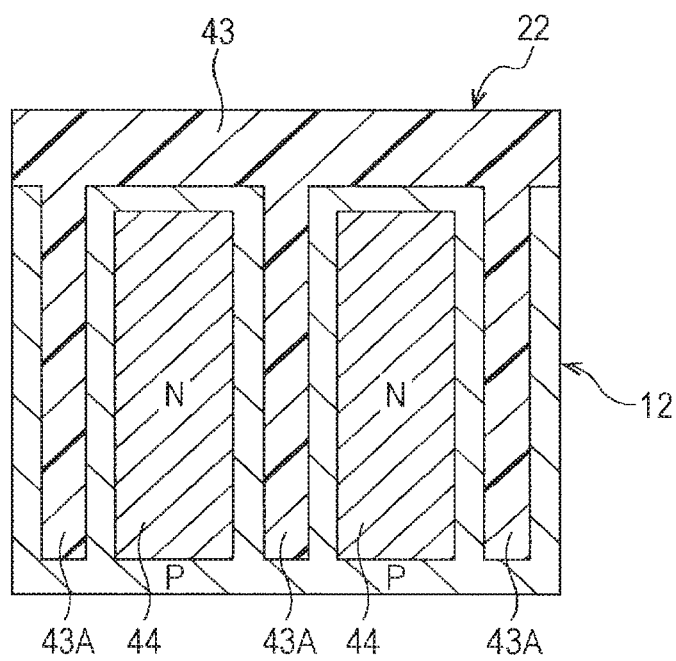
FIG. 11 is a cross-sectional view illustrating a schematic configuration of the pixel in the second embodiment.

FIG. 11 illustrates a cross-sectional view taken along line XI-XI of FIG. 10.

In FIGS. 10 and 11, the same reference numerals are given to the same portions corresponding to FIGS. 3 to 4B in the first embodiment and description of portions duplicating those of the first embodiment is omitted.

As illustrated in FIG. 11, the two trench gate sections 43A of the gate electrode 43 of the first transfer transistor 22 are formed in the first embodiment, but three trench gate sections 43A thereof are formed in the second embodiment. Therefore, two regions are formed between the two trench gate sections 43A and the N-type semiconductor region 44 that is the charge holding region of the memory section 23 is formed in each region. That is, two N-type semiconductor regions 44 are formed as the charge holding region of the memory section 23.

Further, as illustrated in FIG. 10, the area of the N-type semiconductor region 46 in the plane direction that is the FD 25 is also formed largely corresponding to two N-type semiconductor regions 44.

It is possible to further increase the amount of the saturated charges of the memory section 23 by having the configuration as described above.

Moreover, the number of the trench gate sections 43A of the gate electrode 43 of the first transfer transistor 22 may be four or more.

5. Third Embodiment of Pixel 2

A third embodiment of the pixel 2 is described with reference to FIGS. 12 and 13.

Figure 12:
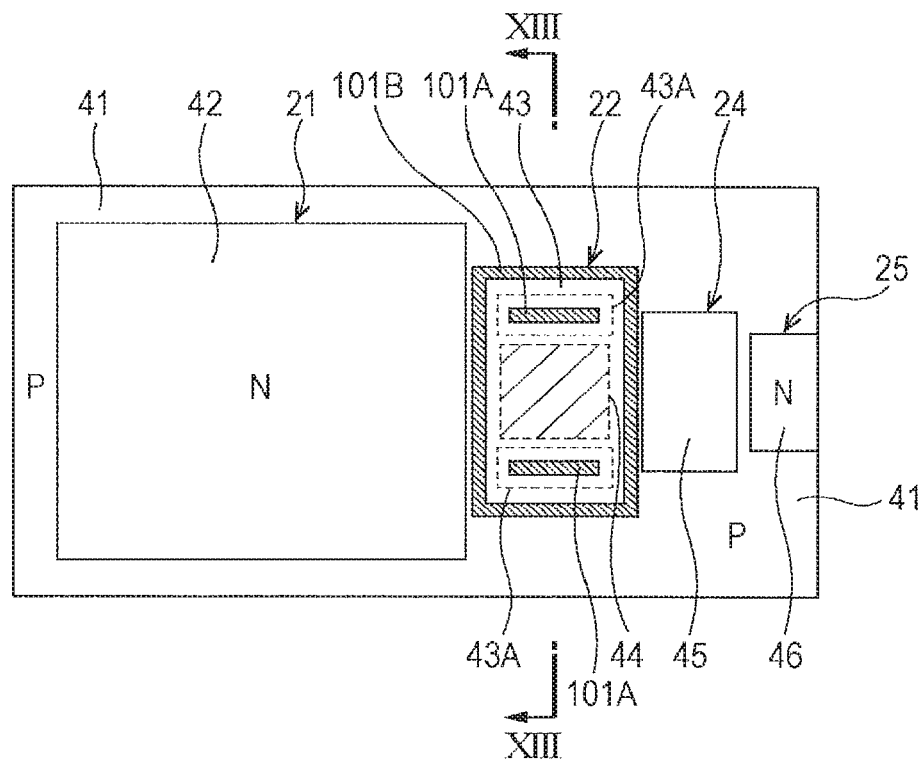
FIG. 12 is a plan view illustrating a schematic configuration of a pixel in a third embodiment.

FIG. 12 is a plan view illustrating a positional relationship between a photodiode 21, a first transfer transistor 22, a memory section 23, a second transfer transistor 24 and a FD 25 inside the pixel 2 in the third embodiment.

Figure 13:
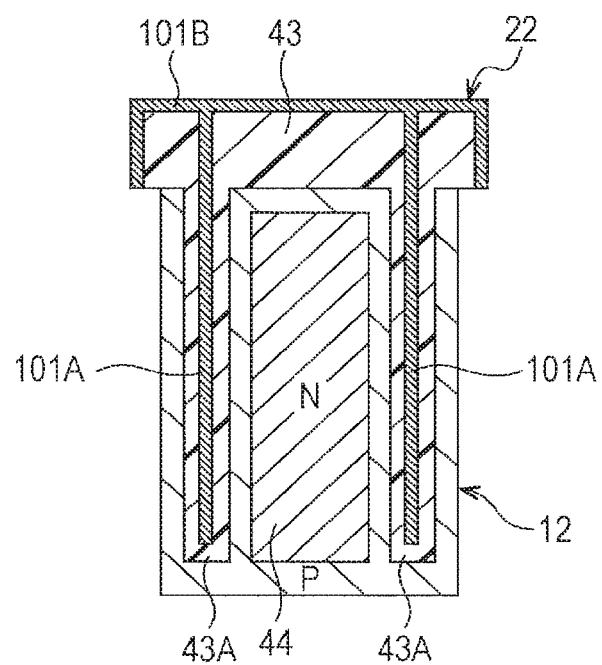
FIG. 13 is a cross-sectional view illustrating a schematic configuration of the pixel in the third embodiment.

FIG. 13 illustrates a cross-sectional view taken along line XIII-XIII of FIG. 12.

In FIGS. 12 and 13, the same reference numerals are given to the same portions corresponding to FIGS. 3 to 4B in the first embodiment and description of portions duplicating those of the first embodiment is omitted.

In the pixel structure to which the present technology is applied, since the N-type semiconductor region 44 of the memory section 23 is formed to a deep position of the semiconductor substrate 12, the light incident to the photodiode 21 may come around the memory section 23 and noise may be generated by the light that is incident coming around.

Thus, in the third embodiment, a structure that prevents the light from coming around the N-type semiconductor region 44 of the memory section 23 is added to the structure that is illustrated as the first embodiment.

Specifically, as illustrated in FIG. 13, a light-shielding section 101A is formed by embedding a light-shielding material such as tungsten (W) inside two trench gate sections 43A of the gate electrode 43 of the first transfer transistor 22.

Further, as illustrated in FIGS. 12 and 13, a light-shielding section 101B is formed by a light-shielding material similar to the light-shielding section 101A so as to cover an upper surface and side surfaces of the gate electrode 43 of the first transfer transistor 22.

Moreover, in the plan view of FIG. 12, illustration of the light-shielding section 101B formed on the upper surface of the gate electrode 43 of the first transfer transistor 22 is omitted.

It is possible to prevent the light from coming around the N-type semiconductor region 44 of the memory section 23 and to suppress occurrence of the noise by having the configuration as described above.

Further, it is possible to increase the amount of the saturated charges of the memory section 23 without lowering the amount of the saturated charges of the photodiode 21 by forming vertically long the N-type semiconductor region 44 as the memory section 23 between the two trench gate sections 43A of the first transfer transistor 22.

6. Fourth Embodiment of Pixel 2

A fourth embodiment of the pixel 2 is described with reference to FIGS. 14 to 15B.

The pixel structure of the first to third embodiments described above is described as the surface irradiation type pixel structure, but it is possible to be applied to any of the surface irradiation type and a back surface irradiation type.

Meanwhile, hereinafter, a pixel structure that is the pixel structure to which the present technology is applied and is specified as having the back surface irradiation type is described.

Figure 14:
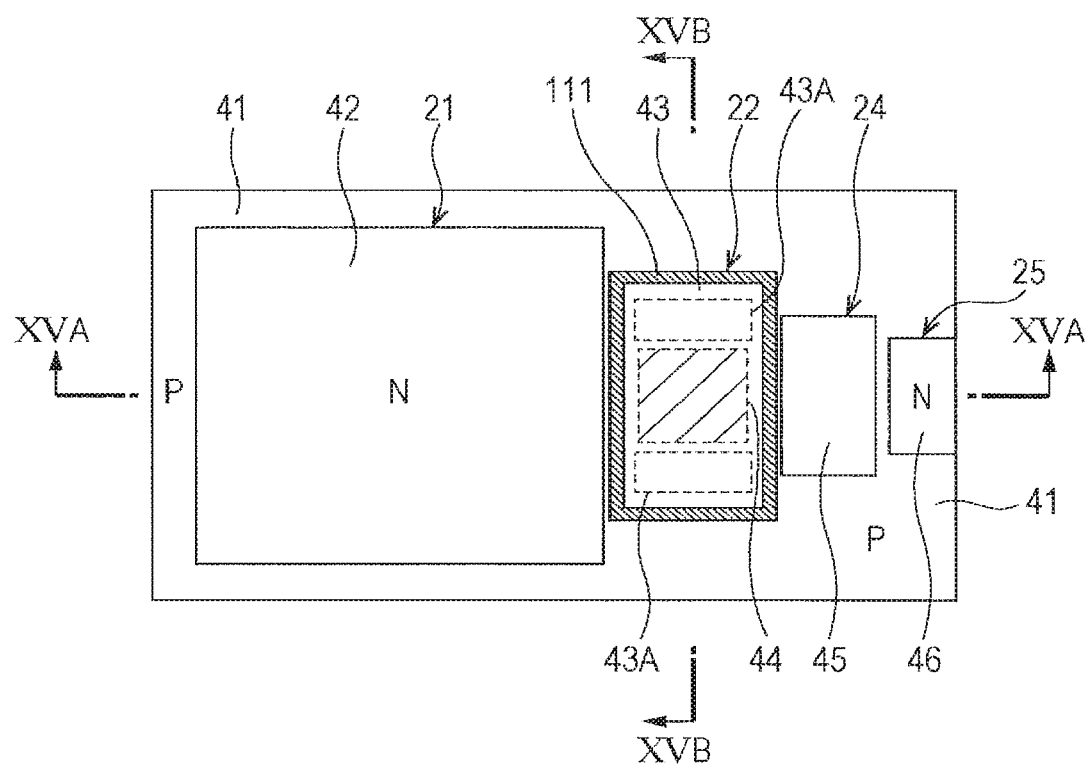
FIG. 14 is a plan view illustrating a schematic configuration of a pixel in a fourth embodiment.

FIG. 14 is a plan view illustrating a positional relationship between a photodiode 21, a first transfer transistor 22, a memory section 23, a second transfer transistor 24 and a FD 25 inside the pixel 2 in the fourth embodiment. However, FIG. 14 is different from the plan views in the first to third embodiments described above in that the plan view is viewed from a surface of the opposite side to the surface on which the light of the semiconductor substrate 12 is incident.

Figure 15B:
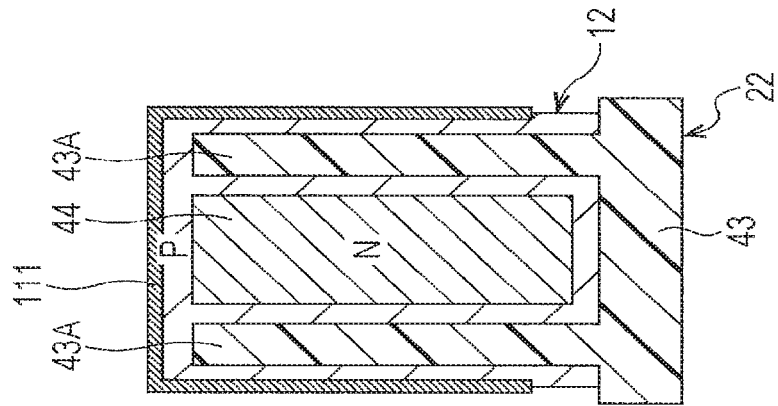
FIGS. 15A and 15B are cross-sectional views illustrating a schematic configuration of the pixel in the fourth embodiment.
Figure 15A:
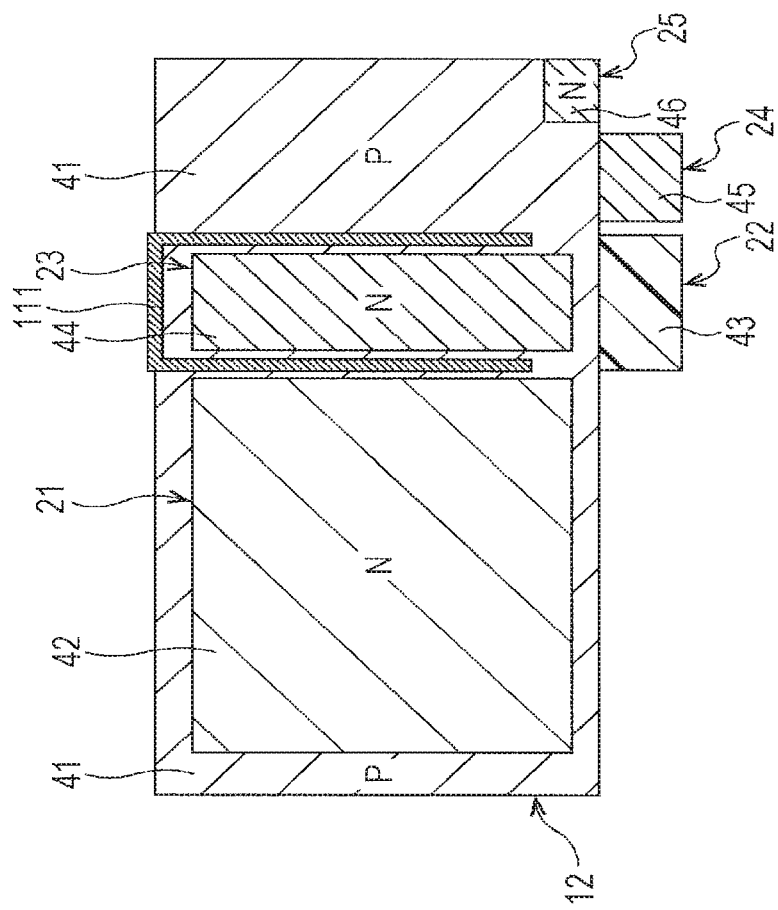

FIG. 15A illustrates a cross-sectional view taken along line XVA-XVA of FIG. 14 and FIG. 15B illustrates a cross-sectional view taken along line XVB-XVB of FIG. 14.

In FIGS. 14 to 15B, the same reference numerals are given to the same portions corresponding to FIGS. 3 to 4B in the first embodiment and description of portions duplicating those of the first embodiment is omitted.

In FIGS. 15A and 15B, the upper side of the view is the back surface side of the semiconductor substrate 12 on which the light is incident and a color film, an on-chip lens or the like is laminated on the upper side of the view of the semiconductor substrate 12.

Meanwhile, as illustrated in FIGS. 15A and 15B, the gate electrode 43 of the first transfer transistor 22, the gate electrode 45 of the second transfer transistor 24 or the like is formed on the lower side of the view of the semiconductor substrate 12. Further, although not illustrated, a multilayered wiring layer that is formed of a plurality of wiring layers and an interlayer insulation film is formed on the lower side of the gate electrode 43 of the first transfer transistor 22 and the gate electrode 45 of the second transfer transistor 24.

The fourth embodiment is similar to the first embodiment described above in that two trench gate sections 43A of the gate electrode 43 of the first transfer transistor 22 are embedded in the depth direction of the semiconductor substrate 12, and the N-type semiconductor region 44 of the memory section 23 is formed vertically long between the two trench gate sections 43A.

However, since the pixel of the fourth embodiment is the back surface irradiation type pixel, the two trench gate sections 43A of the gate electrode 43 of the first transfer transistor 22 extend upward from the back surface side of the semiconductor substrate 12 of the lower side of the view.

Further, also in the fourth embodiment, the structure to prevent the light from coming around the N-type semiconductor region 44 of the memory section 23 is employed. That is, as illustrated in FIGS. 15A and 15B, in order to prevent the light from coming around the memory section 23, a light-shielding section 111 is formed on the back surface that is the side of the light incident surface, and side surfaces to surround the two trench gate sections 43A of the first transfer transistor 22 and the memory section 23.

In the back surface irradiation type pixel structure, it is possible to prevent the light from coming around the N-type semiconductor region 44 that is the memory section 23 and to suppress occurrence of the noise by having the configuration described above.

Further, it is also possible to increase the amount of the saturated charges of the memory section 23 without lowering the amount of the saturated charges of the photodiode 21 by forming vertically long the N-type semiconductor region 44 as the memory section 23 between the two trench gate sections 43A of the first transfer transistor 22.

7. Fifth Embodiment of Pixel 2

A fifth embodiment of the pixel 2 is described with reference to FIGS. 16 to 17B.

The pixel structure of the fifth embodiment is also an example of the back surface irradiation type similar to the fourth embodiment.

Figure 16:
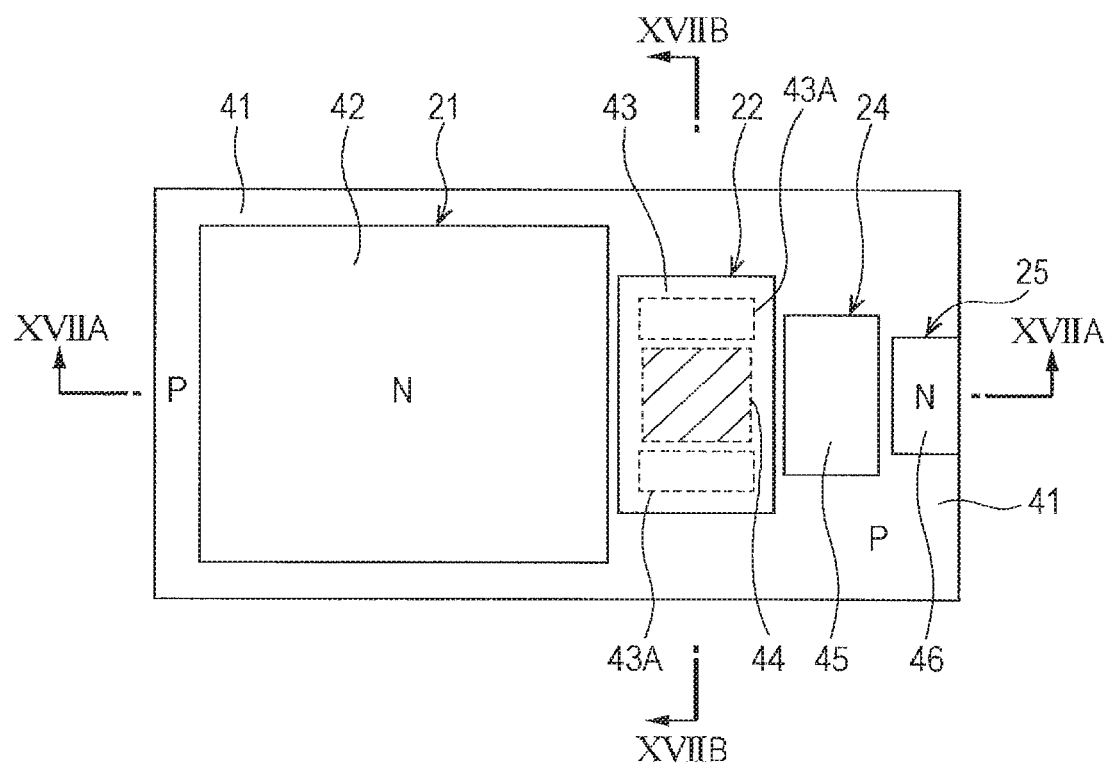
FIG. 16 is a plan view illustrating a schematic configuration of a pixel in a fifth embodiment.

FIG. 16 is a plan view illustrating a positional relationship between a photodiode 21, a first transfer transistor 22, a memory section 23, a second transfer transistor 24 and a FD 25 inside the pixel 2 viewed from the surface of the opposite side to the light incident side of the semiconductor substrate 12 in the fifth embodiment.

FIG. 17A illustrates a cross-sectional view taken along line XVIIA-XVIIA of FIG. 16 and FIG. 17B illustrates a cross-sectional view taken along line XVIIB-XVIIB of FIG. 16.

In FIGS. 16 to 17B, the same reference numerals are given to the same portions corresponding to FIGS. 3 to 4B in the first embodiment and description of portions duplicating those of the first embodiment is omitted.

In the fifth embodiment, as illustrated in FIGS. 17A and 17B, a light-shielding photoelectric conversion film 121 is formed on an entire surface of the back surface side of the semiconductor substrate 12 that is a surface on which the light is incident. Moreover, a color filter or an on-chip lens (not illustrated) is formed on further upper surface of the photoelectric conversion film 121.

For example, the photoelectric conversion film 121 can be formed of a compound semiconductor having a chalcopyrite structure formed of copper-aluminum-gallium-indium-sulfur-selenium-based mixed crystal.

In the pixel structure of the fifth embodiment, since the photoelectric conversion film 121 functions as the light-shielding film, it is possible to prevent the light from coming around the N-type semiconductor region 44 as the memory section 23 and to suppress occurrence of the noise by a further simpler configuration without necessity to provide the light-shielding section 111 as in the fourth embodiment.

Further, it is also possible to increase the amount of the saturated charges of the memory section 23 without lowering the amount of the saturated charges of the photodiode 21 by forming vertically long the N-type semiconductor region 44 as the memory section 23 between the two trench gate sections 43A of the first transfer transistor 22.

8. Application Example to Electronic Apparatus

The present technology is not limited to the application to the solid-state imaging device. That is, the present technology may be applied to an electronic apparatus in general using a solid-state imaging device in an image capturing section (photoelectric convertor) such as an imaging device such as a digital still camera or a digital video camera, a mobile terminal device having an imaging function, and a copy machine using a solid-state imaging device in the image reading unit. The solid-state imaging device may have a form that is formed as one chip or may be a form of a module having the imaging function which is packaged with the imaging section, the signal processor or an optical system.

Figure 18:
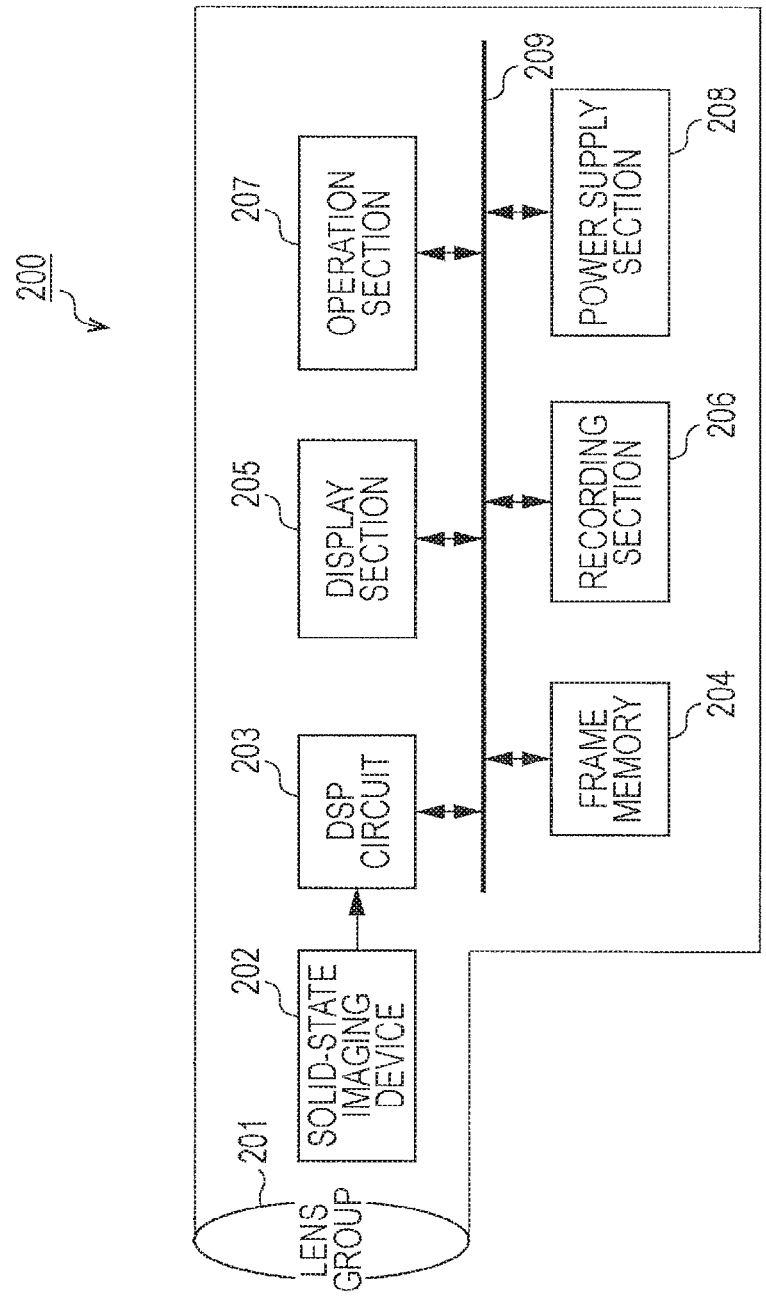
FIG. 18 is a block diagram illustrating a configuration example of an imaging apparatus as an electronic apparatus to which the present technology is applied.

FIG. 18 is a block diagram illustrating a configuration example of an imaging apparatus as an electronic apparatus to which the present technology is applied.

An imaging apparatus 200 illustrated in FIG. 18 includes an optical section 201 formed of a lens group and the like, a solid-state imaging device (imaging device) 202 in which the configuration of the solid-state imaging device 1 of FIG. 1 is employed, and a Digital Signal Processor (DSP) circuit 203 that is a camera signal process circuit. Further, the imaging apparatus 200 includes a frame memory 204, a display section 205, a recording section 206, an operation section 207, and a power supply section 208. The DSP circuit 203, the frame memory 204, the display section 205, the recording section 206, the operation section 207, and the power supply section 208 are connected to each other through a bus line 209.

The optical section 201 forms an image on an imaging surface of the solid-state imaging device 202 by capturing incident light (image light) from an object. The solid-state imaging device 202 converts an amount of the incident light in which the image is formed on the imaging surface by the optical section 201 into an electric signal in pixel units and then outputs the electric signal as the pixel signal. As the solid-state imaging device 202, it is possible to use a solid-state imaging device such as the solid-state imaging device 1 of FIG. 1, that is, the solid-state imaging device that has the pixel structure in which the first transfer transistor 22 has the trench gate structure and the memory section 23 having the vertical PN junction is included between a plurality of trench gate sections 43A which are embedded in the depth direction of the substrate.

For example, the display section 205 is formed of a panel type display device such as a liquid crystal panel or an electro-luminescence (EL) panel, and displays a moving image or a still image that is imaged in the solid-state imaging device 202. The recording section 206 records the moving image or the still image that is captured in the solid-state imaging device 202 on a recording medium such as a hard disk or a semiconductor memory.

The operation section 207 issues operation commands with respect to various functions held in the imaging apparatus 200 under the operation of a user. The power supply section 208 appropriately supplies various powers which are operation powers of the DSP circuit 203, the frame memory 204, the display section 205, the recording section 206, and the operation section 207 to the objects to be supplied.

As described above, as the solid-state imaging device 202, it is possible to increase the area of the photodiode and to realize high sensitivity by using the solid-state imaging device 1 according to the embodiments described above. Therefore, also in the imaging apparatus 200 such as the video camera, the digital still camera, or a camera module for a mobile device such as a mobile phone, it is possible to achieve high image quality in a captured image.

In the embodiment described above, the solid-state imaging device is described in which the first conductivity type is the P-type, the second conductivity type is the N-type and electrons are the signal charges, but the present technology can be also applied to a solid-state imaging device in which positive holes are the signal charges. That is, it is possible to configure each semiconductor region described above as a reversed conductivity type semiconductor region in which the first conductivity type is the N-type and the second conductivity type is the P-type.

Further, the present technology is not limited to the application to the solid-state imaging device that captures the image by detecting the distribution of the incident quantity of light of visible light and may be applied to a solid-state imaging device that captures distribution of an incident quantity of infrared rays, X-rays, particles and the like as an image, or, in a broader sense, a solid-state imaging device (a physical quantity distribution detection device) in general such as a fingerprint detection sensor that captures an image by detecting distribution of other physical quantities such as a pressure or an electrostatic capacitance.

An applicable embodiment of the present technology is not limited to the embodiment described above and may be variously modified without departing from the scope of the present technology.

For example, it is possible to employ a form that combines all or a portion of a plurality of embodiments described above.

Moreover, the effects described in the specification are only illustrative and are not intended to be limited, and there may be effects other than those described in the specification.

Further, the present technology may be configured as described below.

(1) A solid-state imaging device including: a pixel having a photoelectric conversion section that generates and accumulates charges depending on an amount of received light, a charge accumulation section that accumulates the charges that are generated by the photoelectric conversion section, a first transfer transistor that transfers the charges of the photoelectric conversion section to the charge accumulation section, a charge holding section that holds the charges for reading the charges as a signal, and a second transfer transistor that transfers the charges of the charge accumulation section to the charge holding section, in which a gate electrode of the first transfer transistor has two or more trench gate sections embedded from an interface of a semiconductor substrate to a predetermined depth, and in which the charge accumulation section is formed vertically long between two trench gate sections of the first transfer transistor embedded in the semiconductor substrate.

(2) The solid-state imaging device according to (1), in which the charge accumulation section has a PN junction surface in a vertical direction that is a depth direction of the semiconductor substrate.

(3) The solid-state imaging device according to (1) or (2), in which a first conductivity type/a second conductivity type/the first conductivity type semiconductor regions are formed between the two trench gate sections of the first transfer transistor.

(4) The solid-state imaging device according to any one of (1) to (3), in which the charge accumulation section has a semiconductor region having different impurity concentrations in the depth direction of the semiconductor substrate.

(5) The solid-state imaging device according to any one of (1) to (4), in which the gate electrode of the first transfer transistor has two trench gate sections embedded from the interface of the semiconductor substrate to a predetermined depth.

(6) The solid-state imaging device according to any one of (1) to (5), in which the gate electrode of the first transfer transistor has three trench gate sections embedded from the interface of the semiconductor substrate to a predetermined depth.

(7) The solid-state imaging device according to any one of (1) to (6), in which a light-shielding material is embedded inside the trench gate section of the first transfer transistor.

(8) The solid-state imaging device according to any one of (1) to (7), in which the solid-state imaging device has back surface irradiation type device in which light is incident from a back surface of the semiconductor substrate.

(9) The solid-state imaging device according to (8), in which a light-shielding section is formed in a back surface and side surfaces surrounding the two or more trench gate sections and the charge accumulation section therebetween.

(10) The solid-state imaging device according to (8), in which a light-shielding photoelectric conversion film is formed on the back surface that is a side of a light incident surface of the semiconductor substrate.

(11) A manufacturing method of a solid-state imaging device, in a case where a pixel which has a photoelectric conversion section that generates and accumulates charges depending on an amount of received light, a charge accumulation section that accumulates the charges that are generated by the photoelectric conversion section, a first transfer transistor that transfers the charges of the photoelectric conversion section to the charge accumulation section, a charge holding section that holds the charges for reading the charges as a signal, and a second transfer transistor that transfers the charges of the charge accumulation section to the charge holding section, and in which a gate electrode of the first transfer transistor has two or more trench gate sections embedded from an interface of a semiconductor substrate to a predetermined depth is formed, including: forming a trench section that is formed of trench gate sections; and forming a PN junction surface in a vertical direction that is a depth direction of the semiconductor substrate between the two trench sections by injecting a second conductivity type ion at a predetermined tilt angle after injecting a first conductivity type ion at a predetermined tilt angle with respect to the trench section.

(12) The manufacturing method of a solid-state imaging device according to (11), in which acceleration energy is different between the first conductivity type ion injection and the second conductivity type ion injection.

(13) The manufacturing method of a solid-state imaging device according to (11) or (12), in which in the first or second conductivity type ion injection for forming a semiconductor region becoming the charge accumulation section, the predetermined tilt angle varies with depth of the semiconductor substrate.

(14) An electronic apparatus including a solid-state imaging device including a pixel having a photoelectric conversion section that generates and accumulates charges depending on an amount of received light, a charge accumulation section that accumulates the charges that are generated by the photoelectric conversion section, a first transfer transistor that transfers the charges of the photoelectric conversion section to the charge accumulation section, a charge holding section that holds the charges for reading the charges as a signal, and a second transfer transistor that transfers the charges of the charge accumulation section to the charge holding section, in which a gate electrode of the first transfer transistor has two or more trench gate sections embedded from an interface of a semiconductor substrate to a predetermined depth, and in which the charge accumulation section is formed vertically long between two trench gate sections of the first transfer transistor embedded in the semiconductor substrate.

(1') A solid-state imaging device, comprising: a pixel including a photoelectric conversion element configured to generate a charge in response to incident light, a first transfer gate configured to transfer the charge from the photoelectric conversion element to a charge holding section, and a second transfer gate configured to transfer the charge from the charge holding section to a floating diffusion, wherein the first transfer gate includes a trench gate structure having at least two trench gate sections embedded in a depth direction of a semiconductor substrate, and the charge holding section includes a semiconductor region positioned between adjacent ones of the plurality of trench gate sections.

(2') The solid-state imaging device according to (1'), wherein respective ones of the at least two trench gate sections have a dimension in the depth direction which is larger than a dimension in a direction perpendicular to the depth direction.

(3') The solid-state imaging device according to (1') or (2'), wherein a depth of respective ones of the at least two trench gate sections is substantially the same as a depth of the semiconductor region.

(4') The solid-state imaging device according to any one of (1') to (3'), wherein the semiconductor substrate has a first conductivity type and the semiconductor region has a second conductivity type which is opposite the first conductivity type.

(5') The solid-state imaging device according to (4'), wherein a portion of the semiconductor substrate is disposed between the semiconductor region and respective ones of the at least two trench gate sections.

(6') The solid-state imaging device according to (5'), wherein the first conductivity type is P-type, and the second conductivity type is N-type.

(7') The solid-state imaging device according to (5'), wherein the first conductivity type is N-type, and the second conductivity type is P-type.

(8') The solid-state imaging device according to any one of (1') to (7'), wherein the semiconductor region also serves as one of a source or a drain of the second transfer gate.

(9') The solid-state imaging device according to any one of (1') to (8'), wherein the first transfer gate further includes a light-shielding section.

(10') The solid-state imaging device according to (9'), wherein the light-shielding section includes a portion embedded in respective ones of the at least two trench gate sections.

(11') The solid-state imaging device according to (9'), wherein the light-shielding section includes a portion covering an upper surface and side surfaces of the first transfer gate.

(12') The solid-state imaging device according to (9'), wherein a material of the light-shielding section is tungsten.

(13') The solid-state imaging device according to any one of (1') to (12'), wherein the at least two trench gate sections is at least three trench gate sections.

(14') The solid-state imaging device according to any one of (1') to (13'), wherein a material of the first transfer gate is polysilicon.

(15') The solid-state imaging device according to any one of (1') to (14'), wherein the pixel further comprises a discharge gate configured to discharge charges accumulated in the photoelectric conversion element.

(16') The solid-state imaging device according to any one of (1') to (15'), wherein the pixel further comprises a reset gate configured to discharge charges held in the floating diffusion.

(17') The solid-state imaging device according to any one of (1') to (16'), wherein the pixel is a back-side illumination type.

(18') A method of manufacturing a solid-state imaging device, comprising: providing a semiconductor substrate; forming a pixel on the semiconductor substrate, the pixel including a photoelectric conversion element configured to generate a charge in response to incident light, a first transfer gate configured to transfer the charge from the photoelectric conversion element to a charge holding section, and a second transfer gate configured to transfer the charge from the charge holding section to a floating diffusion, wherein the first transfer gate includes a trench gate structure having at least two trench gate sections embedded in a depth direction of a semiconductor substrate, and the charge holding section includes a semiconductor region positioned between adjacent ones of the plurality of trench gate sections.

(19') An electronic apparatus, comprising: an optical section; a solid-state imaging device; and a digital signal processor circuit, wherein the solid-state imaging device includes: a pixel including a photoelectric conversion element configured to generate a charge in response to incident light, a first transfer gate configured to transfer the charge from the photoelectric conversion element to a charge holding section, and a second transfer gate configured to transfer the charge from the charge holding section to a floating diffusion, wherein the first transfer gate includes a trench gate structure having at least two trench gate sections embedded in a depth direction of a semiconductor substrate, and the charge holding section includes a semiconductor region positioned between adjacent ones of the plurality of trench gate sections.

It should be understood by those skilled in the art that various modifications, combinations, sub-combinations and alterations may occur depending on design requirements and other factors insofar as they are within the scope of the appended claims or the equivalents thereof.

What is claimed is:

1. A transistor, comprising:
   a gate electrode disposed on a semiconductor substrate;
   a source region; and
   a drain region, wherein the gate electrode has a trench gate structure including at least two trench gate sections embedded in a depth direction of the semiconductor substrate and a connecting portion connecting the at least two trench gate sections, and one of the source region or the drain region is disposed between adjacent ones of the at least two trench gate sections and underneath the connecting portion.

2. The transistor according to claim 1, wherein respective ones of the at least two trench gate sections have a dimension in the depth direction that is larger than a dimension in a direction perpendicular to the depth direction.

3. The transistor according to claim 1, wherein a depth of respective ones of the at least two trench gate sections is substantially the same as a depth of the one of the source region or the drain region.

4. The transistor according to claim 1, wherein the semiconductor has a first conductivity type and the one of the source region or the drain region has a second conductivity type that is opposite the first conductivity type.

5. The transistor according to claim 4, wherein the first conductivity type is P-type, and the second conductivity type is N-type.

6. The transistor according to claim 4, wherein the first conductivity type is N-type, and the second conductivity type is P-type.

7. The transistor according to claim 1, wherein the semiconductor substrate includes a first portion disposed between a first trench gate section of the at least two trench gate sections and the one of the source region or the drain region, and a second portion disposed between a second trench gate section of the at least two trench gate sections and the one of the source region or the drain region.

8. The transistor according to claim 1, wherein the gate electrode includes a light-shielding section.

9. The transistor according to claim 8, wherein the light-shielding section includes respective portions embedded in corresponding ones of the at least two trench gate sections.

10. The transistor according to claim 8, wherein the light-shielding section includes a portion covering an upper surface and side surfaces of the gate electrode.

11. The transistor according to claim 8, wherein the light-shielding section includes a portion surrounding the at least two trench gate sections on opposite sides thereof.

12. The transistor according to claim 8, wherein a material of the light-shielding section is tungsten.

13. The transistor according to claim 1, wherein a material of the gate electrode is polysilicon.

14. The transistor according to claim 1, wherein the at least two trench gate sections is at least three trench gate sections.

15. A method of manufacturing a transistor, comprising:
providing a semiconductor substrate;
forming a transistor on the semiconductor substrate, the transistor including a gate electrode disposed on the semiconductor substrate, a source region, and a drain region, wherein the gate electrode has a trench gate structure including at least two trench gate sections embedded in a depth direction of the semiconductor substrate and a connecting portion connecting the at least two trench gate sections, and one of the source region or the drain region is disposed between adjacent ones of the at least two trench gate sections and underneath the connecting portion.

16. The method according to claim 15, wherein the gate electrode includes a light-shielding section.

17. The method according to claim 16, wherein the light-shielding section includes respective portions embedded in corresponding ones of the at least two trench gate sections.

18. The method according to claim 16, wherein the light-shielding section includes a portion covering an upper surface and side surfaces of the gate electrode.

19. The method according to claim 16, wherein the light-shielding section includes a portion surrounding the at least two trench gate sections on opposite sides thereof.

20. The method according to claim 15, wherein the at least two trench gate sections is at least three trench gate sections.

* * * * *